United States Patent [19]

Takata et al.

[11] Patent Number: 5,397,913
[45] Date of Patent: Mar. 14, 1995

[54] BIOPOLAR/DARLINGTON TRANSISTOR HAVING ENHANCED COMPREHENSIVE ELECTRICITY CHARACTERISTICS

[75] Inventors: Ikunori Takata; Toshiaki Hikichi, both of Fukuoka, Japan

[73] Assignee: Mitsubishi Denki Kabushiki Kaisha, Tokyo, Japan

[21] Appl. No.: 212,880

[22] Filed: Mar. 15, 1994

Related U.S. Application Data

[62] Division of Ser. No. 16,959, Feb. 12, 1993, abandoned.

[30] Foreign Application Priority Data

Mar. 3, 1992 [JP] Japan .................. 4-45458

[51] Int. Cl.⁶ .................. H01L 29/70; H01L 29/73
[52] U.S. Cl. .................. 257/567; 257/568; 257/539
[58] Field of Search ........... 257/566, 567, 568, 569, 257/570, 539, 541, 542

[56] References Cited

FOREIGN PATENT DOCUMENTS 3104743 1/1982 Germany .
3390378 4/1985 Germany .

OTHER PUBLICATIONS

IEEE Transactions on Electron Devices, Aug. 1976, T. Suzuki, et al., "Application of Low–Impurity Concentration (High–Resistivity) Si Epitaxial Technique to High–Voltage Power Transistors", pp. 982–984.

IEEE Transactions on Electron Devices, vol. ED–23, No. 8, Aug. 1976, Karl Platzoder, et al., "High–Voltage Thyristors and Diodes Made of Neutron–Irradiated Silicon", pp. 805–808.

*Primary Examiner*—Robert P. Limanek
*Assistant Examiner*—Wael M. Fahmy
*Attorney, Agent, or Firm*—Oblon, Spivak, McClelland, Maier & Neustadt

[57] ABSTRACT

A Darlington transistor having improved comprehensive electric characteristic and a bipolar transistor having improved high voltage characteristic are obtained. A collector resistivity $\rho N^-(F)$ of a collector high resistivity layer (11) in a front stage side transistor chip (TF) is set to 80 $\Omega$cm and its collector film thickness $tN^-(F)$ is set to 120 $\mu$m, and a collector resistivity $\rho N^-(R)$ of a collector high resistivity layer (13) in a rear stage side transistor chip (TR) is set to 45 $\Omega$cm and its collector film thickness $tN^-(R)$ is set to 160 $\mu$m. Since $\rho N^-(F) > \rho N^-(R)$ and $tN^-(F) < tN^-(R)$ are satisfied, a Darlington transistor having a good comprehensive electric characteristic can be obtained, and also, since $\rho N^-(R)/tN^-(R) < 0.6$ is satisfied, a bipolar transistor having a good high voltage characteristic can be obtained (FIG. 8).

8 Claims, 33 Drawing Sheets

FIXED
PULSE WIDTH

F I G . 3 3
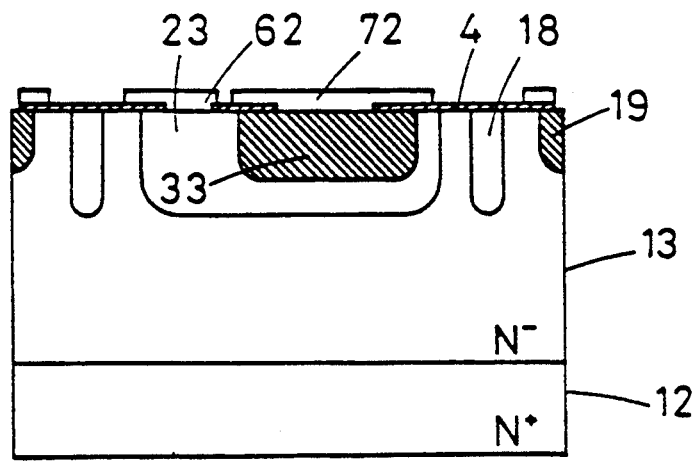
F I G . 3 4
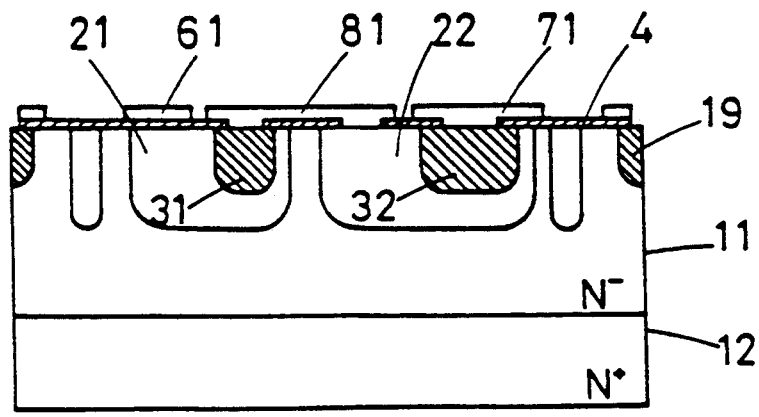

BIOPOLAR/DARLINGTON TRANSISTOR HAVING ENHANCED COMPREHENSIVE ELECTRICITY CHARACTERISTICS

This is a division of application Ser. No. 08/016,959, filed Feb. 12, 1993, now abandoned.

BACKGROUND OF THE INVENTION

1. Field of the Invention

The present invention relates to an improvement of enhancing a comprehensive electricity characteristic including a high voltage property and a low voltage property in a high-voltage power Darlington transistor.

The present invention also relates to a comprehensive technology for improving a high voltage property of a high-voltage power transistor as well as a Darlington transistor.

2. Description of the Prior Art

Arrangement of Prior Art Darlington Transistor

FIG. 44 is a circuit diagram showing a configuration of a power transistor arranged in a two-stage Darlington connection (Darlington transistor). As shown in FIG. 44, the Darlington transistor consists of two stages; a first stage bipolar transistor Q1 has its emitter connected to a base of a second stage bipolar transistor Q2, and the transistors Q1 and Q2 have their respective collectors connected commonly to each other. Resistances R1 and R2 are provided between emitters and bases of the transistors Q1 and Q2, respectively.

FIG. 45 is a sectional view showing a configuration of the two-stage Darlington transistor. As shown in FIG. 45, a collector high resistivity layer 11 is formed on a collector low resistivity layer 12. A base region 21 is formed in an area A1 in an upper portion of the collector high resistivity layer 11 while a base region 22 is formed in an area A2 in the same portion, and emitter regions 31 and 32 are selectively formed in surfaces of the base regions 21 and 22, respectively. A collector electrode 5 is formed on a surface of the collector low resistivity layer 12; a base electrode 6 is formed on the base region 21 of the transistor Q1; an emitter electrode 7 is formed on the emitter region 32 of the transistor Q2; and a base-emitter connecting electrode 8 is formed over from the emitter region 31 of the transistor Q1 to the base region 22 of the transistor Q2. Reference numerals 4, 18 and 19 denote an oxide film, a girdling, and a channel stop, respectively.

Throughout the description in this specification, a resistivity of the collector high resistivity layer 11 is referred to as "collector resistivity $\rho N-$" while a thickness of the collector high resistivity layer just below the base regions 21 and 22 is referred to as "collector thickness $tN-$".

Available Upper Limit Voltage of Transistor

Now an evaluation of an available upper limit voltage in such a prior art transistor will be described.

There are various kinds of rated voltages of transistors, but there is no authorized theory which gives an explanation covering all the kinds of available upper limit voltage of transistors. To preliminarily explain the circumstances in more detail, definitions of various kinds of rated voltage of transistors will first be described.

<2-1. Rated Voltage of Transistor>

The quantities expressing rated voltages of a transistor include the following (1) $BV_{CBO}$ Characteristic quantity $BV_{CBO}$ represents the voltage at which breakdown current begins flowing when the voltage between the collector and base is slowly raised with the emitter being opened. The breakdown current to be considered is approximately 0.1 mA in a power transistor. The quantity, in this specification, is referred to as "emitter opening breakdown voltage".

(2) $BV_{CEO}$

Characteristic quantity $BV_{CEO}$ represents the voltage at which breakdown current begins flowing when the voltage between the collector and emitter is slowly raised with the base being opened. The breakdown current to be considered is approximately 10 mA in a power transistor. The quantity, in this specification, is referred to as "base opening breakdown voltage".

(3) $V_{CEO}(SUS)$

A voltage value in a state where a large amount of current flows and voltage is retained is referred to as a "sustain voltage". There are two kinds of sustain voltages, namely, $V_{CEO}(SUS)$ and $V_{CEX}(SUS)$.

The sustain voltage $V_{CEO}(SUS)$ is the emitter-collector voltage measured in a state where base reverse current $I_{B2}$ of a transistor T1 does not flow but base forward current $I_{B1}$ alone flows in a circuit shown in FIG. 46. The quantity, in this specification, is referred to as a "first type sustain voltage".

There often arises a confusion as to how the results of measuring the first type sustain voltage $V_{CEO}(SUS)$ should be interpreted. The reason for this is explained below:

In many power transistors, a resistance is usually connected in parallel between their bases and emitters. The main reason for this is that a front stage of a Darlington connection transistor is reverse biased between its base and emitter during its OFF time. Besides, an effect can be expected that a stable operation is attained against a rapid voltage change between its collector and emitter. Such a voltage change causes current to flow to the emitter through a capacitor between the collector and base, which is substantially equivalent to that the current flows from the base to the emitter. In other words, if a resistance is connected in parallel between the base and emitter, bypassing the equivalent current from the base to the emitter through the resistance can prevent an operation of the transistor from being unstable.

For this reason, in many cases a resistance is connected in parallel between the base and emitter, and the resistance between the base and emitter enables a substantially slight base reverse current $I_{B2}$ to flow even if an external base reverse current $I_{B2}$ is zero. This is because the emitter of the front stage transistor is at a finite potential at a certain level during the ON time of the transistor, and this allows current to flow from the emitter through the resistance to the base.

Thus, a measured value of the first type sustain voltage $V_{CEO}(SUS)$ under low voltage is able to vary in a large scale depending upon a value of the resistance, and measurement conditions cause the measured value of the first type sustain voltage $V_{CEO}(SUS)$ to have variety. However, such an influence is relatively decreased as a measured current becomes larger.

A typical first type sustain voltage $V_{CEO}(SUS)$ is a value in the case where there is no resistance between the base and emitter. In this case, the measured value of the first type sustain voltage $V_{CEO}(SUS)$ under constant current is theoretically the same as the base opening breakdown voltage $BV_{CEO}$.

Unlike measurement of a second type sustain voltage $V_{CEX}(SUS)$, as mentioned later, has been experimintally found that measurement of the first type sustain voltage $V_{CEO}(SUS)$ is conducted relatively safely with a little danger in breakdown.

(4) $V_{CEX}(SUS)$

On the other hand, the sustain voltage $V_{CEX}(SUS)$ is measured such that the base reverse current $I_{B2}$ is led in the circuit of FIG. 46 after the base forward current $I_{B1}$ is led, as shown in FIG. 47. Although $V_{CC}$ in FIG. 47 is a low voltage of approximately 10 V through several tens volts, high voltage is applied to a transistor under measurement where the current is almost the same as that which flows during its ON time and is flowing because a variation in load current causes inductance of a load to induce a reverse electromotive force as the transistor commences turning off. In the case where no clamp circuit is included in the transistor under measurement, a voltage across opposite terminals of the transistor under measurement rises up to a voltage retaining capability of the transistor. In this specification, the quantity is referred to as "second type sustain voltage". Measurement of the second type sustain voltage $V_{CEX}(SUS)$ is an extremely precise test the simple conduction of which might cause breakdown of most transistors under measurement. Thus, it is ordinary practice that a capacitive power source is set to a predetermined voltage lower than the sustain voltage of the transistor under measurement, and a diode connected in series with it are connected in parallel between the collector and emitter so that a voltage over the predetermined voltage at the power source is not applied to the transistor under measurement.

<2-2. Circumstances of Ways of Representing Voltage Rating in Transistor>

Although "base opening breakdown voltage $BV_{CEO}$" or "first type sustain voltage $V_{CEO}(SUS)$" have been widely used as ways of representing a voltage rating in transistors, in these years there has been a tendency to substitute the "second type sustain voltage $V_{CEX}(SUS)$" for them. It is certain that capability of actual products have come to be higher than the range determined by the conventional base opening breakdown voltage $BV_{CEO}$ or the first type sustain voltage $V_{CEO}(SUS)$, but there has been no authorized theoretical support for this. (There is also no authorized support for the theory that the base opening breakdown voltage $BV_{CEO}$ or the first type sustain voltage $V_{CEO}(SUS)$ constitutes a limit of transistors).

<2-3. Endurance Limit of Breakdown>

Measured current of the conventional sustain voltage $V_{CEX}(SUS)$ or $V_{CEO}(SUS)$ is in most cases approximately 1A indifferent of the rated current in the transistor under measurement, and such a value cannot give any guarantee for the available upper limit voltage of the transistor. This is because measurement of the sustain voltage $V_{CEX}(SUS)$ or $V_{CEO}(SUS)$ is conducted as a sort of property of withstand voltage, and a conventional rated voltage in transistors completely lacks a concept of an "endurance limit of breakdown" which means a guarantee for operating voltage in a situation where large current flows.

<2-4. Safety Operation Zone>

The operating voltage in the situation where large current flows is shown with a safety operation zone indifferent of a withstand voltage rating. The safety operation zone (FIG. 48 illustrates the safety operation zone) is defined by an envelope related to current-voltage conditions under which the device is actually broken under a measurement of the circuit of FIG. 46 in the condition that a load inductance and supply voltage ($V_{CC}$) are determined so that a large current may flow. A vertical limit line on the high voltage side and a horizontal limit line on the high current side are not based upon an actual measurement of breakdown. The upper limit on the side of high voltage is fixed at a rated voltage RV. The Upper limit on the large current side is fixed at a value approximately twice much as the rated current RC. Either of them are not related to an actual capability of a transistor, but it define a guaranteed zone for safety operation by the manufacturer.

Transistors have an unclear problem of secondary breakdown, and so there had long been a time when the transistors are not suitable to a general high voltage operation. It was not so long ago that the safety operation zone came to be labeled. (Even in the current stage, the safety operation zone is represented not as a rating but as typical data.) In such a time, it was hardly thinkable that the transistors are generally used as major elements for an inverter in a pulse width modulating method. However, transistors suitable for such an inverter began to be manufactured as products for general purpose, and their endurance limit of a short-circuit began to cause severe trouble in 1983.

The "safety operation zone" is precisely referred to as "reverse bias safety operation zone", which is relevant to breakdown caused during the OFF time of a transistor conducting a switching operation. This is measured under the conditions of the vicinities of ultimate voltage and ultimate rated current.

Besides, the "safety operation zone" there includes a "forward bias safety operation zone" which, relates to a restriction of an operation zone which is caused by local temperature rising during the ON time of a transistor and is measured under the conditions of approximately medium voltage and medium current (e.g., measured under the conditions of 10 through 100 V and several A for a transistor of practically used voltage 200 V).

<2-5. Endurance Limit of Breakdown by Short-Circuit>

Relatively recently, there has widely been known a sort of endurance limit of breakdown which cannot be expressed by the concept of "safety operation zone". This is called an "endurance limit of breakdown by short-circuit". The endurance limit of breakdown by short-circuit is a sort of endurance limit under forward bias, but it is different in voltage and current zones from a conventionally highly appraised "forward bias safety operation zone".

Specifically, when a load short-circuit arises, current flows, which is four to six times as much as the rated current, while a high voltage about 80% of the first type sustain voltage $V_{CEO}(SUS)$ rating is being applied. An operation zone in this case is much superior to a conventional safety zone.

<2-6. Conclusion of Current Understanding of a Phenomenon of Transistor Breakdown>

As has been described, there can be seen a very large variety of phases of transistor breakdown. At present, a state especially in the vicinity of the voltage threshold zone of the safety operation zone is unknown yet.

Such an unclear situation can be proved by the fact that the substance of the phenomenon of breakdown of a high voltage large current region in a transistor has not yet been understood, and manufacturers and users have treated it simply as a phenomenon.

After all, the current state should be recognized as "Empiric measurement alone is the criterion which can be relied upon."

<2-7. Example in the Case of Transistors for AC 220 V Line>

At present, "600 V" of a "600 V transistor" for an AC 220 V line represents a guaranteed value of the second type sustain voltage $V_{CEX}(SUS)$. When this product became commercially available several years ago, it had a 450 V guarantee on the first type sustain voltage $V_{CEO}(SUS)$ and was named "450 V transistor." For use under AC 220 V supply voltage, a transistor which can endure about a 450 V voltage including a raised voltage upon rectification, surge voltage, and a variation in the supply voltage is required. However in those days or before, the operation upper limit voltage of transistors had been represented by the base opening breakdown voltage $BV_{CEO}$ or the first type sustain voltage $V_{CEO}(SUS)$.

At present, transistors of the AC 220 V line are currently commercially available, have basically no problem, and they seem to have the sufficient past record of actual use (for more than about ten years).

600 V transistors used for the AC 220 V line have the past record that having a collector film thickness $tN^-$ through 60 $\mu$m, they present a sufficient endurance limit of breakdown. To satisfy the rating of the first type sustain voltage $V_{CEO}(SUS)$, a collector resistivity $\rho N^-$ must be about 40 $\Omega$cm or over including variations caused in manufacturing, (40 through 60 $\Omega$cm have been used).

Circumstances of Transistors for Higher Voltage

<3-1. Conventional Method of Determining $\rho N^-$ and $tN^-$>

It will be described below, in designing a transistor for higher voltage based upon the experiment about the transistors for the AC 220 V line, how the most significant collector resistivity $\rho N^-$ and collector film thickness $tN^-$ were conventionally determined.

An obstacle to making a power transistor suitable for under a high voltage is not only a static withstand voltage property but an endurance limit of breakdown. It is empirically well known that the endurance limit of breakdown depends mostly upon the collector film thickness $tN^-$ and that a thickness in proportion with a voltage to be used is required.

FIG. 49 shows an electric field intensity distribution of a high resistivity layer (the collector high resistivity layer 11 in FIG. 45) at a point where breakdown of a transistor for AC 220 V line and a transistor for a double of the voltage begins. A region II presents an electric field intensity of the transistor for an AC 220 V line while a region I presents an increment of voltage. An absolute value of an inclination of the electric field is in reverse proportion to the collector resistivity $\rho N^-$.

Although the collector film thickness $tN^-$ must be doubled in view of the endurance limit of breakdown, this is not enough to double static withstand voltage (integrated value of the electric field intensity). In other words, as can be seen from FIG. 49, the collector resistivity $\rho N^-$ must be doubled to double the integrated value of the electric field intensity.

In this way, making transistors suitable for use under high voltage has conventionally been attained by basically increasing the collector film thickness $tN^-$ and collector resistivity $\rho N^-$ in proportion to each other.

As a result, the transistor used for the AC 220 V line has been made with $tN^-$ of about 60 $\mu$m and $\rho N^-$ of about 40 through 60 $\Omega$cm, while the transistor used for the AC 440 V line has been made with $tN^-$ of about 120 $\mu$m and $\rho N^-$ of 80 through 120 $\Omega$cm.

However, in the transistor for a high voltage designed as mentioned above (e.g., the transistor for the AC 440 V line), an accidental breakdown still happens at a higher rate than that caused in the transistor for the AC 220 V line. Although it may be expected that a voltage rising itself causes some difficulty, there remains some possibility that the transistor for the AC 440 V line is not yet optimized, and it has been desirable to improve it.

SUMMARY OF THE INVENTION

According to the present invention, a bipolar transistor comprises a collector low resistivity layer; a collector high resistivity layer formed on the collector low resistivity layer and having its resistivity set higher than a resistivity of the collector low resistivity layer; a base region formed in a surface of the collector high resistivity layer; and an emitter region formed in a surface of the base region; characterized in that a rate $\rho/t$ of a resistivity $\rho$ ($\Omega$cm) of the collector high resistivity layer to a film thickness $t$ ($\mu$m) of the collector high resistivity layer just below the base region is 0.6 or under.

Preferably, the bipolar transistor further comprises a base electrode formed on the base region; and an emitter electrode formed on the emitter region.

The present invention is also directed to a Darlington transistor comprising a first bipolar transistor formed on a first semiconductor substrate; and a second bipolar transistor formed on a second semiconductor substrate; the first and second bipolar transistors being arranged in Darlington connection, having a front stage of the first bipolar transistor and a rear stage of the second bipolar transistor; the first bipolar transistor including a first collector low resistivity layer, a first collector high resistivity layer formed on the first collector low resistivity layer and having its resistivity set higher than a resistivity of the first collector low resistivity layer, a first base region formed in a surface of the first collector high resistivity layer, and a first emitter region formed in a surface of the first base region; the second bipolar transistor including a second collector low resistivity layer, a second collector high resistivity layer formed on the second collector low resistivity layer and having its resistivity set higher than a resistivity of the second collector low resistivity layer, a second base region formed in a surface of the second collector high resistivity layer, and a second emitter region formed in a surface of the second base region; characterized in that a resistivity of the first collector high resistivity layer is set higher than a resistivity of the second collector high resistivity layer.

Preferably, a film thickness of the first collector high resistivity layer just below the first base region is set smaller than a film thickness of the second collector high resistivity layer just below the second base region.

Preferably, first to M (an integer of 2 or above)-th transistors arranged in Darlington connection, a m-th stage transistor ($1 \leq m < M$) is provided as a front stage transistor; and a (m+1)-th stage transistor is provided as a rear stage transistor.

Preferably, M=2 and m=1; the resistivity of a first stage transistor of the front stage transistor is 110 Ωcm and the film thickness is 110 μm; and the resistivity of a second stage transistor of the rear stage transistor is 45 Ωcm and the film thickness is 160 μm.

Preferably, M=3 and m=1; the resistivity of a first stage transistor of the front stage transistor is 120 Ωcm and the film thickness is 80 μm; and the resistivity of a second stage transistor of the rear stage transistor is 45 Ωcm and the film thickness is 140 μm.

Preferably, M=4 and m=3; the resistivity of a third stage transistor of the front stage transistor is 120 Ωcm and the film thickness is 80 μm; and the resistivity of a fourth stage transistor of the rear stage transistor is 45 Ωcm and the film thickness is 140 μm.

Preferably, M=4 and m=2; the resistivity of a second stage transistor of the front stage transistor is 120 Ωcm and the film thickness is 80 μm; and the resistivity of a third stage transistor of the rear stage transistor is 45 Ωcm and the film thickness is 140 μm.

Preferably, M=4 and m=1; the resistivity of a first stage transistor of the front stage transistor is 120 Ωcm and the film thickness is 80 μm; and the resistivity of a second stage transistor of the rear stage transistor is 45 Ωcm and the film thickness is 140 μm.

The present invention is also directed to method of fabricating a bipolar transistor comprising a first step of forming a collector high resistivity layer on a collector low resistivity layer to have its resistivity set higher than a resistivity of the collector low resistivity layer; a second step of forming a base region in a surface of the collector high resistivity layer; and a third step of forming an emitter region in a surface of the base region; characterized in that a rate $\rho/t$ of a resistivity $\rho$ (Ωcm) of the collector high resistivity layer to a film thickness t (μm) of the collector high resistivity layer just below the base region is 0.6 or under.

Preferably, a method of fabricating a bipolar transistor further comprises, subsequent to the third step, a fourth step of forming a base electrode on the base region; and a fifth step of forming an emitter electrode on the emitter region.

Preferably, the first step includes the steps of preparing a silicon monocrystal rod; irradiating the silicon monocrystal rod with neutrons to form a high resistivity region in the silicon monocrystal rod; cutting the silicon monocrystal rod into a semiconductor substrate formed of the high resistivity region; introducing impurity in front and rear surfaces of the semiconductor substrate to form a low resistivity region in the front and rear surface of the semiconductor substrate; and cutting the low resistivity region formed in the surface of the semiconductor substrate to define the high resistivity region remaining in the semiconductor substrate as the collector high resistivity layer and to define the low resistivity region formed in the rear surface of the semiconductor substrate as the collector low resistivity layer.

Preferably, the first step includes the steps of preparing a semiconductor substrate formed of a low resistivity region; and forming a layer formed of a high resistivity region on the semiconductor substrate by epitaxial growing to define the semiconductor substrate except said layer as the collector low resistivity layer and to define the layer as the collector high resistivity layer.

Preferably, the second step includes the steps of forming an oxide film on a surface of the collector high resistivity layer; patterning the oxide film; and diffusing impurity of a predetermined conductivity type to a specified depth in the collector high resistivity layer in the oxidizing atmosphere to form the base region.

Preferably, the third step includes the steps of forming an oxide film on a surface of the collector high resistivity layer; patterning the oxide film; and diffusing impurity of a conductivity type different from the predetermined conductivity type up to a specified depth in the collector high resistivity layer in the oxidizing atmosphere to form the emitter region.

The present invention is also intended for a method of fabricating a Darlington transistor comprising the steps of forming a first bipolar transistor in a first semiconductor substrate; forming a second bipolar transistor in a second semiconductor substrate; and arranging the first and second bipolar transistors in Darlington connection, with a front stage of the first bipolar transistor and a rear stage of the second bipolar transistor; the step of forming the first bipolar transistor including the steps of forming a first collector high resistivity layer on a first collector low resistivity layer to have its resistivity set higher than a resistivity of the first collector low resistivity layer; forming a first base region in a surface of the first collector high resistivity layer; and forming a first emitter region in a surface of the first base region; the step of forming the second bipolar transistor including the steps of forming a second collector high resistivity layer on a second collector low resistivity layer to have its resistivity set higher than a resistivity of the second collector low resistivity layer; forming a second base region in a surface of the second collector high resistivity layer; and forming a second emitter region in a surface of the second base region; characterized in that a resistivity of the first collector high resistivity layer is set larger than a resistivity of the second collector high resistivity layer.

Preferably, a film thickness of the first collector high resistivity layer just below the first base region is smaller than a film thickness of the second collector high resistivity layer just below the second base region.

According to the present invention, the bipolar transistor as defined in Claim 1 and the bipolar transistor manufactured in a method as defined in Claim 4 keep the ratio $\rho/t$ of the resistivity $\rho$ (Ωcm) of the collector high resistivity layer to the film thickness t(μm) of the collector high resistivity layer just below the base region at 0.6 or under, and therefore the high voltage property can be enhanced.

The darlington transistor as defined in Claim 2 and the darlington transistor manufactured in a method as defined in Claim 5 have a resistivity of the first collector high resistivity layer of the front stage bipolar transistor higher than that of the second collector high resistivity layer of the rear stage bipolar transistor, and therefore, a good endurance limit of breakdown in a high voltage region can be obtained without worsening an endurance limit of short-circuit.

In addition to that, the Darlington transistor as defined in Claim 3 and the Darlington transistor manufactured in a method as defined in Claim 6 have a smaller film thickness of the first collector high resistivity layer just below the first base region of the front stage bipolar transistor than that of the second collector high resistivity layer just below the second base region of the rear stage bipolar transistor, and therefore, the low voltage property (saturation voltage) can be improved.

Accordingly, it is an object of the present invention to establish a principle to explain an available upper limit voltage of transistors, and to improve the high voltage property of a high voltage power transistor according to the principle.

It is another object of the present invention to enhance a comprehensive electricity characteristic including a high voltage property and a low voltage property in a high voltage power Darlington transistor. These and other objects, features, aspects and advantages of the present invention will become more apparent from the following detailed description of the present invention when taken in conjunction with the accompanying drawings.

BRIEF DESCRIPTION OF THE DRAWINGS

FIG. 33 is a sectional view showing a method of manufacturing the Darlington transistor of the first preferred embodiment;

FIG. 34 is a sectional view showing a method of manufacturing the Darlington transistor of the first preferred embodiment;

DETAILED DESCRIPTION OF THE PREFERRED EMBODIMENT

Basic Theory of the Preferred Embodiment

Previous to explaining exemplary arrangements of preferred embodiments of the present invention, facts observed by the inventor of the present invention and theories established based upon them will be explained in relation to an NPN transistor.

These theories are roughly classified into two groups, or three groups in view of particulars.

<Theory on a General Bipolar Transistor>
In an NPN transitor, $$\rho N^-(\Omega cm) < 0.6 \times tN^-(\mu m) \quad (1)$$

must be satisfied in its arrangement.

Specifically, if a rate "r" is defined as $$r = \rho N^-(\Omega cm)/tN^-(\mu m) \quad (2)$$

the requirement of the above formula (1) can be expressed as follows:

$$0 < r < 0.6 \quad (3)$$

<Theory 2> Theory on a Darlington Transistor
<Theory 2-1>

"A collector resistivity $\rho N^-$ of a front stage of a transistor arranged in Darlington connection should be larger than a collector resistivity $\rho N^-$ of its rear stage."
<Theory 2-2>

"In a transistor arranged in Darlington connection, the above <Theory 2-1> should be satisfied, and additionally, a collector film thickness $tN^-$ in a front stage of the transistor should be smaller than a collector film thickness $tN^-$ in its rear stage."

Explanation about Theory 1 and Theory 2

<2-1. Results of Measurement>

Figure 1:
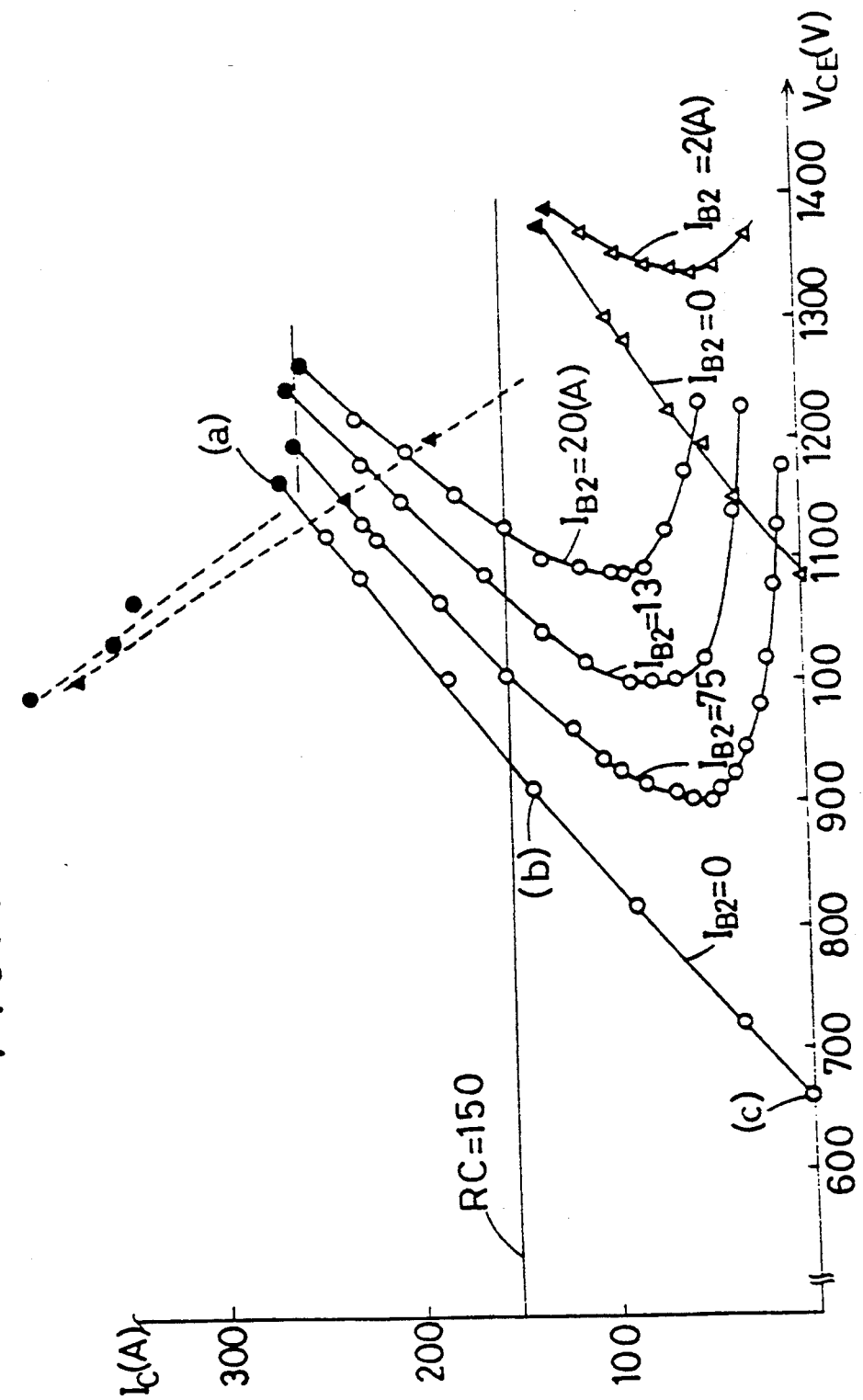
FIG. 1 is a graph showing results of measurement of an endurance limit of reverse bias breakdown with reverse base current being varied.
Figure 46:
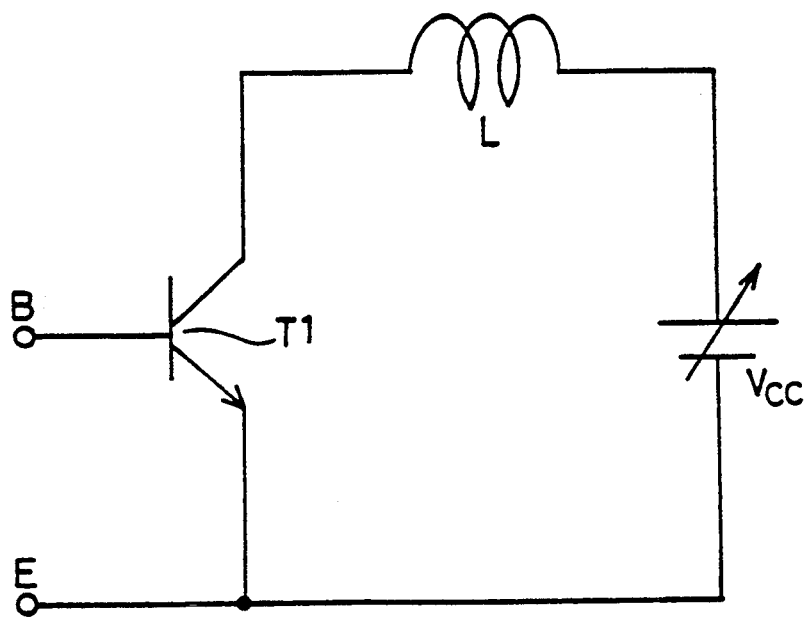
FIG. 46 is a circuit diagram for explaining sustain voltage.
Figure 47:
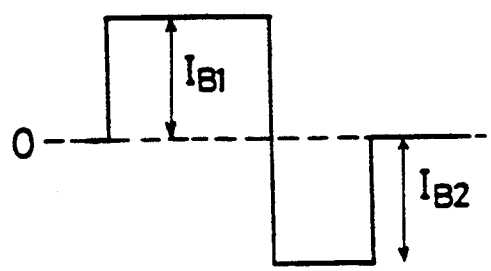
FIG. 47 is a waveform diagram for explaining the sustain voltage.
Figure 48:
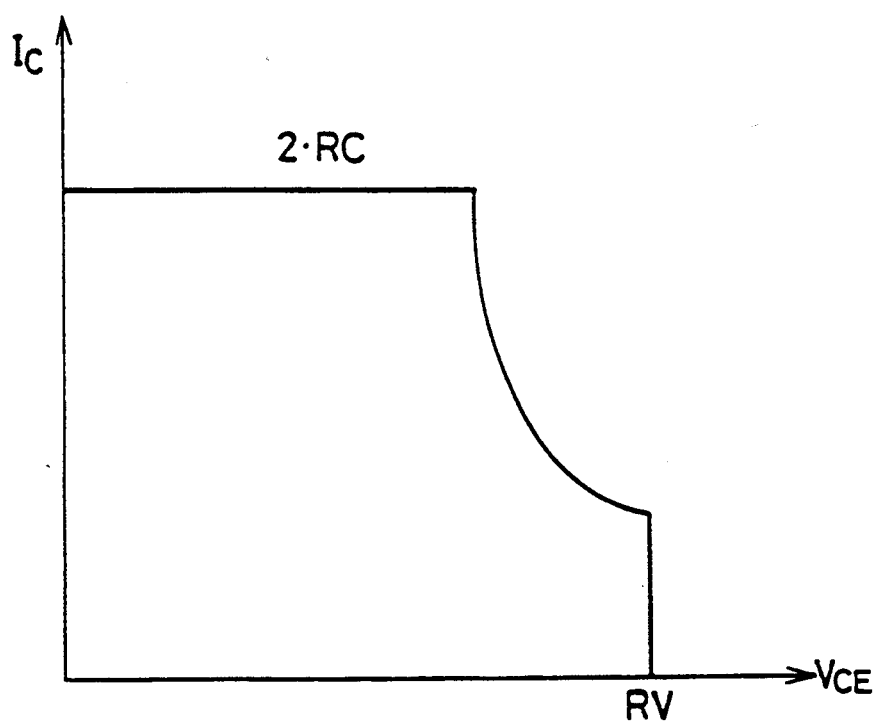
FIG. 48 is a graph for explaining a safety operation zone.
Figure 49:
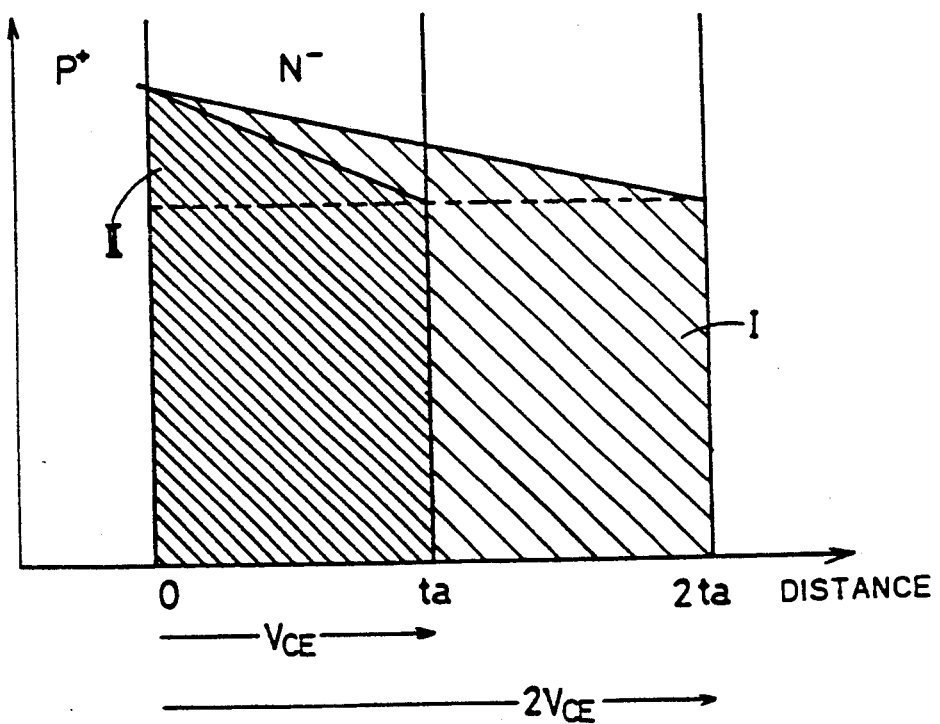
FIG. 49 is a graph showing a distribution of an electric field intensity of a collector high resistivity layer.

FIG. 1 shows results of a measurement where an endurance limit of breakdown by reverse bias measured in the circuit shown in FIG. 46 is measured with reverse base current being varied, where the:

Blank circle is a locus of a sustain waveform of a $\rho N^- = 45$ $\Omega$cm sample;

Solid circle is a breakdown point of the $\rho N^- = 45$ $\Omega$cm sample;

Blank triangle is a locus of a sustain waveform of a $\rho N^- = 80$ $\Omega$cm sample; and Solid triangle is a breakdown point of the $\rho N^- = 80$ $\Omega$cm sample.

In those resistivities, a linear waveform which is closest to a low tension side is a first type sustain voltage VCEO(SUS) waveform. The collector film thickness $tN^-$ of either sample is about 140 $\mu$m. From the results of measurement of them, it is found that:

"Increasing reverse base current $I_{B2}$ makes the sustain waveform bend backward and also makes it move toward a high voltage side."

A breakdown point of a relatively low voltage, which is shown by the broken line inclining right downward, is caused by the so-called reverse bias breakdown. The breakdown point shown by the horizontal dash-dot line is a point where breakdown arises as a current value is increased observing the sustain waveform. There has been almost no report about the manner of the latter breakdown point. However, it will be apparently recognized merely from FIG. 1 that a constant value is presented depending upon a resistivity. The inventor of the present invention empirically recognized that breakdown in this mode is determined only by the resistivity.

<2-2. Theoretical Explanation of the Relation between Endurance Limit of Breakdown and $\rho N^->$ The relation between an endurance limit of breakdown and a collector resistivity $\rho N^-$ will now be explained.

The most significant factor which contributes to a current-voltage property of a transistor in a high voltage region is electron multiplication. Voltage increase causes an increase in generation of electrons and holes. Holes which are generated by the electron multiplication and reach a base region are the factor which functions the same as the ordinary base current to turn the transistor ON. However, recombination of electrons and holes existing in the base region suppresses such a transistor operation. When the transistor operates in a stable state, these contradictory actions must be balanced with each other.

FIG. 1 shows three kinds of states of a representative operating point of a VCEO(SUS) waveform, (a), (b) and (c).

Figure 2:
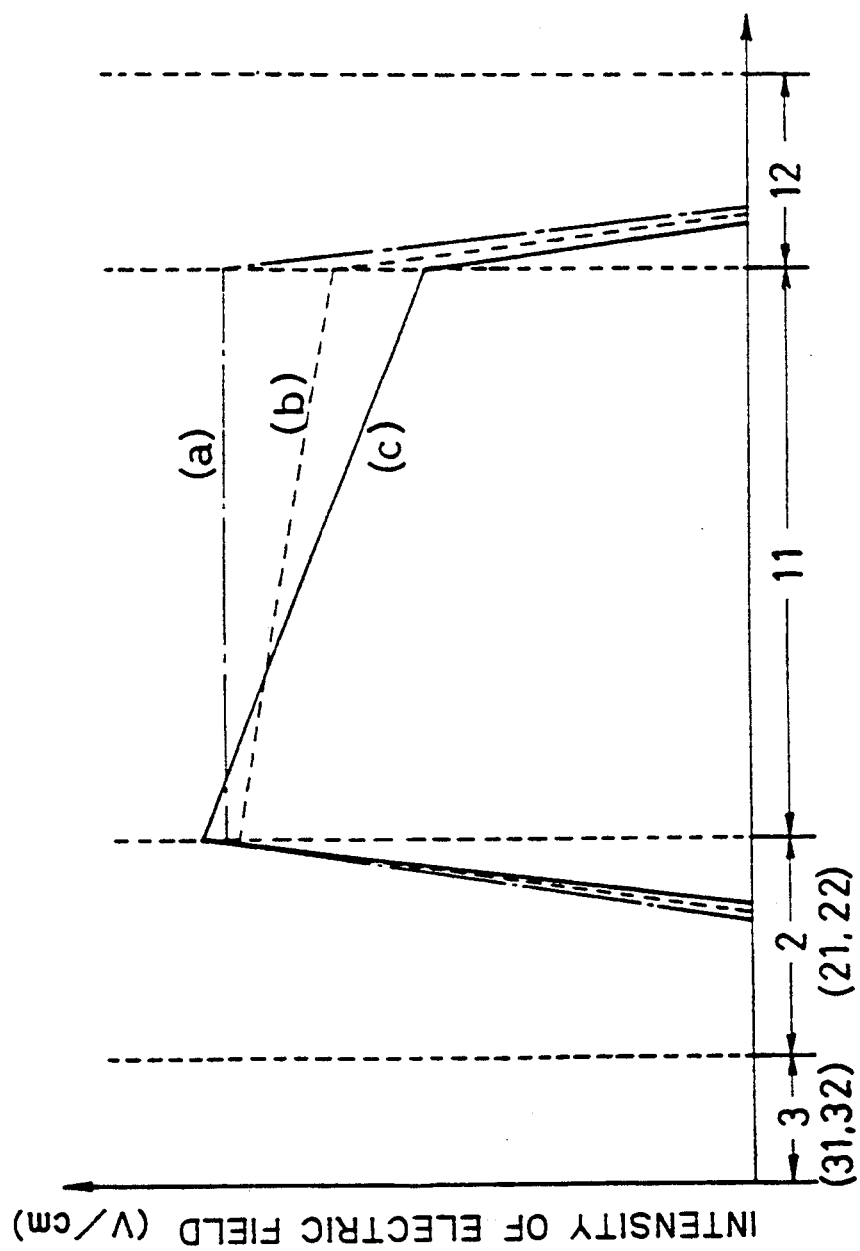
FIG. 2 is a graph showing internal an electric field when high voltage is applied between a collector and emitter of an NPN transistor.
Figure 45:
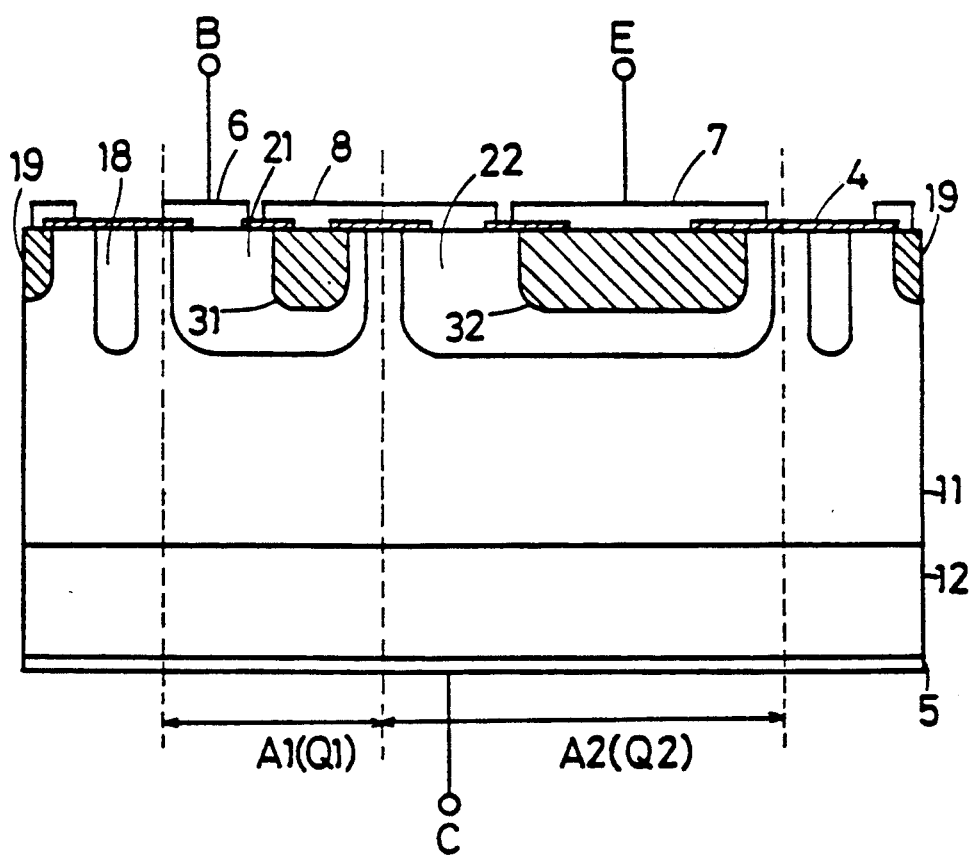
FIG. 45 is a sectional view showing an arrangement of a prior art two-stage Darlington transistor.

FIG. 2 shows an internal electrical field in the case where high voltage is applied between a collector and emitter of an NPN transistor. A vertical axis indicates an electric field intensity while a horizontal axis indicates emitter, base and collector layers. Solid line shows a state corresponding to the point (c) of FIG. 1, the broken line shows a state corresponding to the point (b), and the dash-dot line shows a state corresponding to the point (a), respectively. For convenience, reference numerals in FIG. 45 are used for corresponding parts in the following description.

When voltage is applied between the collector and emitter, a depletion layer expands from the boundary of a PN junction of the base and collector, and then an electric field within the collector high resistivity layer 11 presents the greatest intensity in the PN junction. An inclination of the electric field is shown by a linear line tilting right downward at an angle in proportion to an N-type impurity concentration within the collector high resistivity layer 11. The electric field strongly depends upon the electron multiplying feature. As voltage rises, it is caused sooner or later that the number of holes and electrons generated by electron multiplication begins increasing rapidly. The holes generated directly enter a base region 2 (21, 22) and act as base current. When the number of the holes becomes larger than the number of holes which are dissipated by recombination of electrons and holes within the base region 2 the collector current begins flowing. The state of the point (c) lies in the critical point of this.

Then, the state of the point (b) where the collector current flows to some extent will be described. The collector current flows under the condition that the holes generated by the electron multiplication and the holes dissipated in the base region 2 are well balanced (seemingly, a situation where breakdown current flows is likely to be understood as a special situation, but merely something completely the same as an ordinary ON operation arises in the base region 2).

The electron multiplication is caused primarily in a portion where the strongest electric field exists (P-N junction). Electrons generated therein lie in a depletion layer with a density in proportion to a current value. The electrons electrically compensate part of positive ions of impurity atoms in the collector high resistivity layer 11. Consequently, an inclination of the electric field in the collector high resistivity layer 11 is moderated. This means that a transistor has a negative feedback mechanism against an increase of the reverse collector current (breakdown current). This negative feedback mechanism can explain a characteristic of the sustaining phenomenon, namely, that a stable observation can be attained.

The right downward inclination of the electric field in the collector high resistivity layer 11 is in proportion to a density of electric charge in the high resistivity layer 11 which is depleted, and hence, the inclination is moderated more and more as the collector current increases.

In a state where the collector current further increases and where the electrons of a component of the collector current and the impurity atoms become identical in density to each other, the electric field in the collector high resistivity layer 11 presents a flat distribution as shown by the dash-dot line (a) in FIG. 2.

In this situation, the above-mentioned arrangement of the negative feedback disappears, which brings about instability. For example, in the event where the current further increases, the flat distribution of the electric field tends to turn to a distribution of a right upward inclination, but the holes generated by the electron multiplication tends to cause an electric field distribution of a right downward inclination. This results in a unique electric field distribution where the intensity of the electric field is very large at the opposite sides of the collector high resistivity layer 11 but very low in its central part. Applied voltage is an integral value of the high resistivity layer 11. Thus, under the same applied voltage, the maximum intensity of the electric field at the opposite sides of the collector high resistivity layer 11 in the above-mentioned unique distribution is larger than that in the flat distribution of the electric field. The electron multiplication caused at the opposite sides of the collector high resistivity layer 11 presents an electric field distribution of right downward inclination on the P-N− junction side while it presents an electric field distribution of right upward inclination on the N−-N+ junction side. Specifically, once the above-mentioned unique distribution of the electric field where the opposite sides gradually depress and the bottom lingers between them is developed, a phenomenon of positive feedback where the opposite sides depress steeply and deeply is caused. Although these are all observed simply within the collector high resistivity layer 11, an increase in collector current caused by the generated holes acting as base current must be considered in a practical transistor. It is concluded that a current value at which a flat distribution of the electric field is presented is a critical point at which stability of the transistor operation drastically deteriorates. Especially under the high voltage at which the sustain phenomenon is caused, such transistor operation is the very cause of breakdown. This is a point of breakdown shown by the point (a) in FIG. 1.

Although an illustrative situation of the first type sustain voltage $V_{CEO}(SUS)$ where a base terminal is opening has been described, the same theory can be used for the explanation of a situation of the second type sustain voltage $V_{CEX}(SUS)$ where the base current is drawn from the base terminal. The situation about the second type sustain voltage $V_{CEX}(SUS)$ is simply modified in that the cause of dissipation of holes in the base region is a supply of the reverse base current as well as the recombination of electrons. Specifically, the collector current flows under the circumstance where outflow of the holes from the base region (recombination of the holes + reverse base current) and outflow of the holes by the electron multiplication are well balanced with each other.

The fact that as the reverse base current increases, higher voltage must be applied to obtain the electron multiplication well balanced with the increased reverse base current supports the tendency that as the reverse base current increases, the second type sustain voltage $V_{CEX}(SUS)$ shifts toward high voltage.

<2-3. Results of Measurement and Principle Obtained from Theory Analysis>

<2-3-1. Resistivity and Endurance Limit of Breakdown>

It is expected that there is a clear boundary between a sustaining zone where the transistor works in a stable state and a breakdown zone, and the boundary is featured in a current value corresponding to a state where the density of electrons constituting the collector current and the impurity density in the collector high resistivity layer.

Thus, increasing the density of impurity in the collector high resistivity layer 11, that is, decreasing the resistivity, the current value representing the boundary can be increased, and the endurance limit of breakdown can be considerably enhanced.

As the density of impurity in the collector high resistivity layer 11, rising voltage ($BV_{CEO}$) of the first type sustain voltage $V_{CEO}(SUS)$ falls. Conventionally, a correspondence of the first type sustain voltage $V_{CEO}(SUS)$ to the operation limit was simply empirically known, but it has been found that there is no less than several hundreds volts of difference between the rising voltage and the breakdown point. It has also been found that the rising voltage can be sharply raised by a reverse biasing between the base and emitter.

<2-3-2. Endurance Limit of Breakdown by Load Short-Circuit>

However, an adverse effect is exerted by setting a low resistivity $\rho N^-$ of the collector high resistivity layer. This is the case where a load is short-circuited by the Darlington connection.

When the load is short-circuit, excessive current flows with the voltage equal to the voltage before the load short-circuit being applied for the transistor to perform an ordinary ON-operation. The transistor must endure this situation for a period from detecting such an abnormal state until completing a break of the base current (approximately several tens $\mu sec$).

Figure 3:
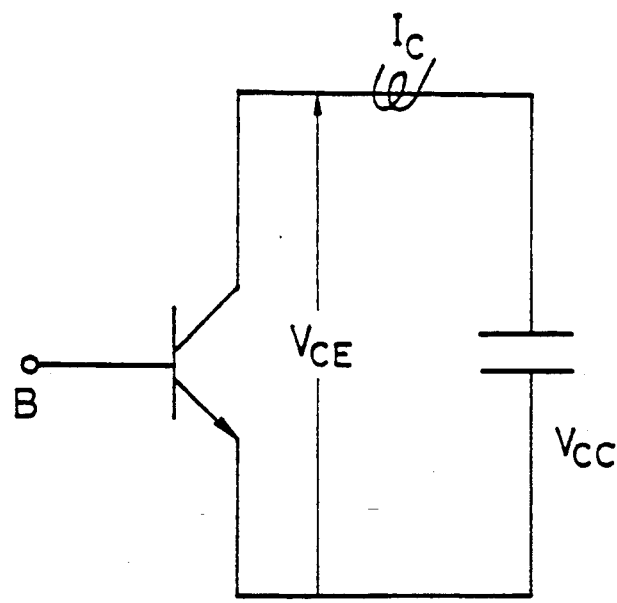
FIG. 3 is a circuit diagram showing an arrangement of a circuit for a short-circuit breakdown test.
Figure 4:
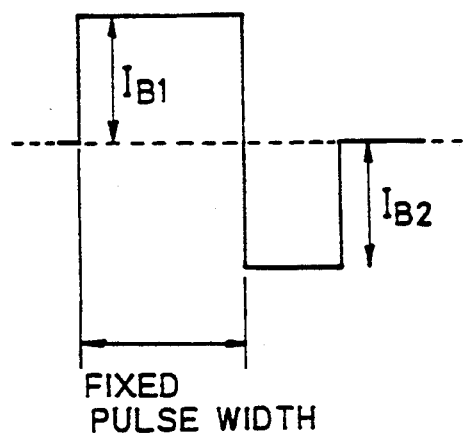
FIG. 4 is a waveform diagram showing base current applied to a transistor shown in FIG. 3.

FIG. 3 shows a test circuit for breakdown by short-circuit.

Figure 5:
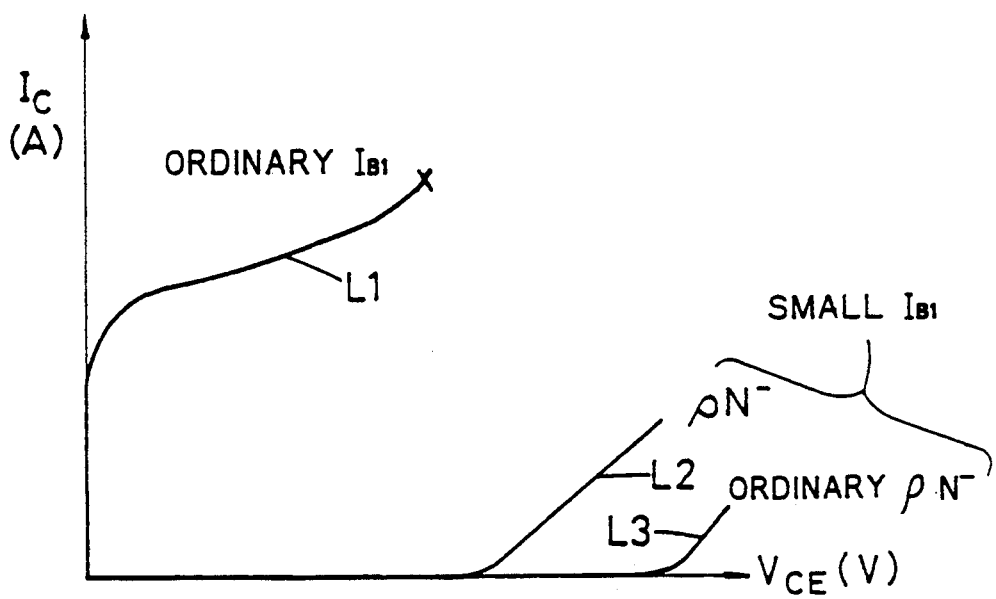
FIG. 5 is a graph showing a short-circuit breakdown phenomenon in a transistor.

Setting supply voltage of this circuit to a certain value, a single shot of the base current with a fixed time width (about 50 μs) is supplied to the transistor to turn it ON. At this time the maximum value of the collector current (IC) and the collector-emitter voltage (VCE) are read. FIG. 5 shows this operation be repeated with the supply voltage 0 gradually raised until the instant of breakdown. Breakdown by short-circuit in transistors can be classified into two modes where the breakdown is caused by temperature rise in a chip and where the breakdown is caused the instant the applied voltage reach a specified value. Measurement procedure shown herein is for observing the latter mode. The breakdown point is marked with symbol X.

It has been found that within a time of approximately several tens μsec, short-circuit breakdown caused by the temperature rise in the transistor would not occur under the suppressed applied voltage.

A case where a single transistor without Darlington connection will now be described. A curve L1 in FIG. 5 represents measurement results in the event where a base current value ($I_{B1}$) under the condition of ordinary use.

Curves L2 and L3 in FIG. 5 are obtained when extremely small base current ($I_{B1}$) is supplied; the curve L2 is a result when the collector resistivity $\rho N^-$ is small while the curve L3 is a result when the collector resistivity $\rho N^-$ is at an ordinary level.

A means for improving an endurance limit of breakdown by load short-circuit is suppressing an overflow of the collector current. As one of ways for this, these examples of the curves L2 and L3 can be recognized as properties in extreme cases where some arrangement is applied to make the base current small upon short-circuit. A waveform of the curve L2 is substantially the same as a waveform of the first type sustain voltage VCEO(SUS) of FIG. 1. Although the rising voltage of the first type sustain voltage VCEO(SUS) depresses as the collector resistivity $\rho N^-$ is decreased, there is no danger of breakdown till the voltage and current value reach the level the same as in the breakdown in the above-mentioned sustain phenomenon. While voltage which causes the breakdown of the sustain phenomenon is about the rated voltage, voltage which causes the load short-circuit is about 80% of the rated voltage. Thus, merely restricting the collector current, the transistor can theoretically avoid the short-circuit breakdown. Thus, with such an arrangement, the reduction of the collector resistivity $\rho N^-$ theoretically exerts no adverse effect.

Figure 6:
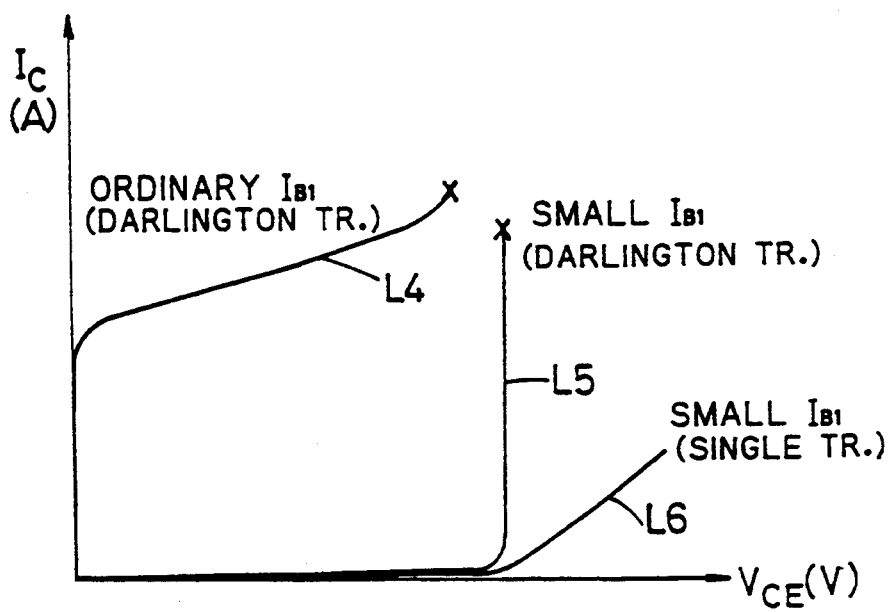
FIG. 6 is a graph showing a short-circuit breakdown phenomenon in a Darlington transistor.

FIG. 6 shows results of a measurement of a Darlington connection transistor corresponding to the measurement of FIG. 5. A curve LA expresses an example of short-circuit of a Darlington transistor with the base current value ($I_{B1}$) under the condition of ordinary use, a curve L5 expresses an example of a Darlington transistor with an extremely small base current value ($I_{B1}$), and a curve L6 expresses an example of a single transistor with a small base current value ($I_{B1}$). A Darlington connection transistor has a large current amplification factor hFE, and therefore, when the transistor is measured with the extremely small base current value ($I_{B1}$), rising of the collector current rapidly occurs.

The cause of this is that a first stage of the Darlington transistor is extraordinarily smaller in collector current density than its second stage. In the sustain phenomenon, holding voltage increases as the current density increases. This is because the collector density of the first stage of the Darlington transistor is 1/hFE as much as the current density of its second stage, and therefore, the holding voltage hardly increase even if the collector current value in the first stage increases.

Even with an elaborate arrangement of an external circuit of the transistor to improve the endurance limit of short-circuit, the endurance limit of short-circuit more than a voltage value corresponding to the base opening breakdown voltage BVCEO cannot be obtained.

In this way, setting the resistivity $\rho N^-$ of a high resistivity layer to a relatively low level, there arises the difficulty that the upper limit voltage in the event where a short-circuit protecting circuit is used is limited to the base opening breakdown voltage value BVCEO.

However, it is possible that the limitation of the endurance limit of short-circuit when the collector resistivity $\rho N^-$ is reduced is released.

This can be attained, as to the resistivity of the high resistivity layer of the collector, by setting the resistivity of the first stage of the transistor higher than that of its last stage.

Endurance limit of breakdown by reverse bias highly depends upon the resistivity of the collector high resistivity layer of the last stage, and it becomes larger as the resistivity becomes lower.

Particulars of Theory

<3-1. Results of Experiment with Variable Rate r of $\rho N^-$ to $tN^-$>

Figure 7:
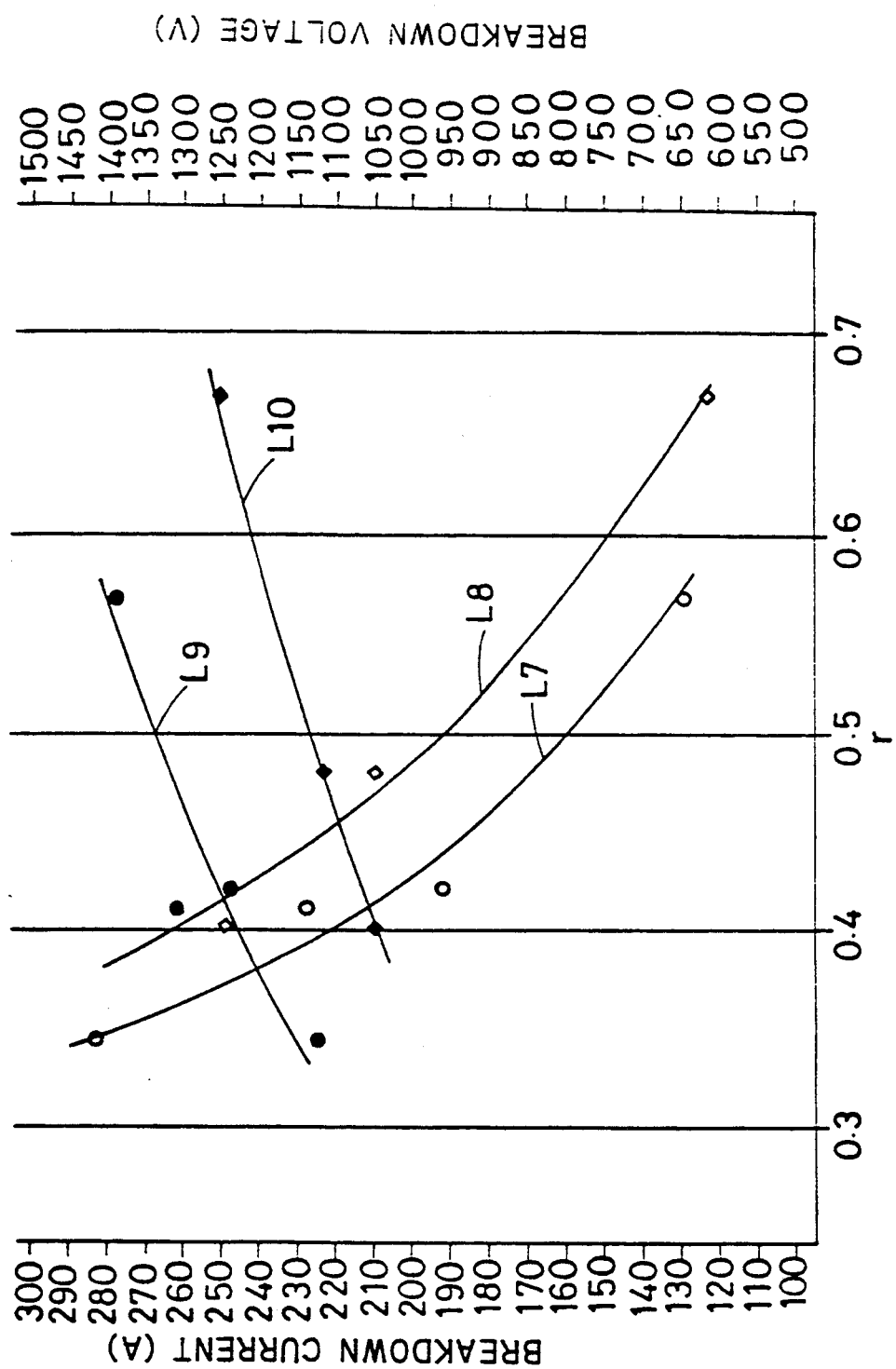
FIG. 7 is a graph showing variations in breakdown voltage and breakdown current in an NPN transistor.

FIG. 7 shows results of an experiment with a variable rate r of the collector resistivity $\rho N^-$ to the collector film thickness $\rho N t^-$ in a single NPN transistor, where a value of the collector film thickness $tN^-$ is shown as a parameter. This breakdown is caused related to the first type sustain voltage VCEO(SUS), and the breakdown voltage value is set for a chip arrangement equivalent to rating 150 A.

In FIG. 7;

A curve L7 expresses breakdown current at the collector film thickness $tN^- = 140$ μm (marked with ○);

A curve L8 expresses breakdown current at the collector film thickness $tN^- = 120$ μm (marked with ◇);

A curve L9 expresses breakdown current at the collector film thickness $tN^- = 140$ μm (marked with ●); and A curve L10 expresses breakdown current at the collector film thickness $tN^- = 120$ μm (marked with ◆).

As can be seen from FIG. 7, as the rate r becomes smaller, the breakdown current increases and the breakdown voltage depresses.

<3-2. Preferable Range of the Rate r>

As can be seen in FIG. 7, when the rate r is in a range smaller than 0.6, the breakdown current can be enhanced without depressing the breakdown voltage so much. Compared with a rate of change in the breakdown current to a change in the breakdown voltage, the change rate of the breakdown voltage is smaller. Thus, determining the collector resistivity $\rho N^-$ and the collector film thickness $tN^-$ so that the rate r is in a range smaller than 0.6 as stage above, it is possible that a high voltage characteristic of a transistor pertaining to both the breakdown current and breakdown voltage is improved.

The lower limit of the rate r is a positive value determined depending upon a value of the required breakdown voltage.

Contents of the Preferred Embodiments

With an example of a current representative bipolar transistor classified in 1000 through 1200 V used for an inverter for AC 440 V line will now be described in conjunction with various preferred embodiments of the present invention. Darlington transistors in the preferred embodiments are formed so as to meet both of the <Theory 2-1> and <Theory 2-2> in the present invention. Part of a plurality of transistors contained in the Darlington transistors is configured in accordance with <Theory 1> of the present invention.

In ordinary use, a conventional Darlington transistor classified in 100 through 1200 V have three transistors formed on an identical chip and arranged in three-stage Darlington connection.

In a Darlington transistor of this embodiment, however, its front and rear stages are different in value of the collector resistivity $\rho N^-$, and therefore, it is difficult to make both a front stage transistor and a rear stage transistor in a single chip. Thus, the front stage transistor and the rear stage transistor are formed in different chips, which, in turn, are connected by wiring to each other.

In general, when M is an integer of 2 or more, first to M-th transistors arranged in Darlington connection can be classified as follows:

Front stage transistor: a first stage transistor through an m-th stage transistor, and Rear stage transistor: an (m+1)-th stage transistor through Mth transistor, where m is an integer which satisfies a requirement as follows:

$$1 \leq m \leq M \qquad (4)$$

In the embodiment of the present invention, the front stage transistor defined in the above-mentioned way is formed in a first chip while the rear stage transistor is formed in a second chip. Then, there should be the following relation between a collector resistivity $\rho N^-(F)$ pertaining to the front stage transistor and a collector resistivity $\rho N^-(R)$ pertaining to the rear stage transistor;

$$\rho N^-(F) > \rho N^-(R) \qquad (5)$$

and there should also be the following relation between a collector film thickness $tN^-(F)$ pertaining to the front stage and a collector film thickness $tN^-(R)$ pertaining to the rear stage;

$$tN^-(F) < tN^-(R) \qquad (6)$$

With further generalization, it follows that M transistors are classified into K groups ($K \geq 2$), the transistors in each group are formed in one or more ships so as to satisfy the following requirement;

$$\rho N^-(i) > \rho N^-(i+1) \qquad (7)$$

and also there is the following relation between the collector film thickness $tN^-(F)$ pertaining to the front stage and the collector film thickness $tN^-(R)$ pertaining to the rear stage;

$$tN^-(i) < tN^-(i+1) \qquad (8)$$

where $\rho N^-(i)$ and $tN^-(i)$ are the collector resistivity $\rho N^-(i)$ and collector film thickness $tN^-(i)$ of the transistors in an (i)th group.

<4-1. Arrangement of a Device of a First Preferred Embodiment>

A Darlington transistor of a first preferred embodiment is equivalent to a case where M=3 and m=2.

Figure 8:
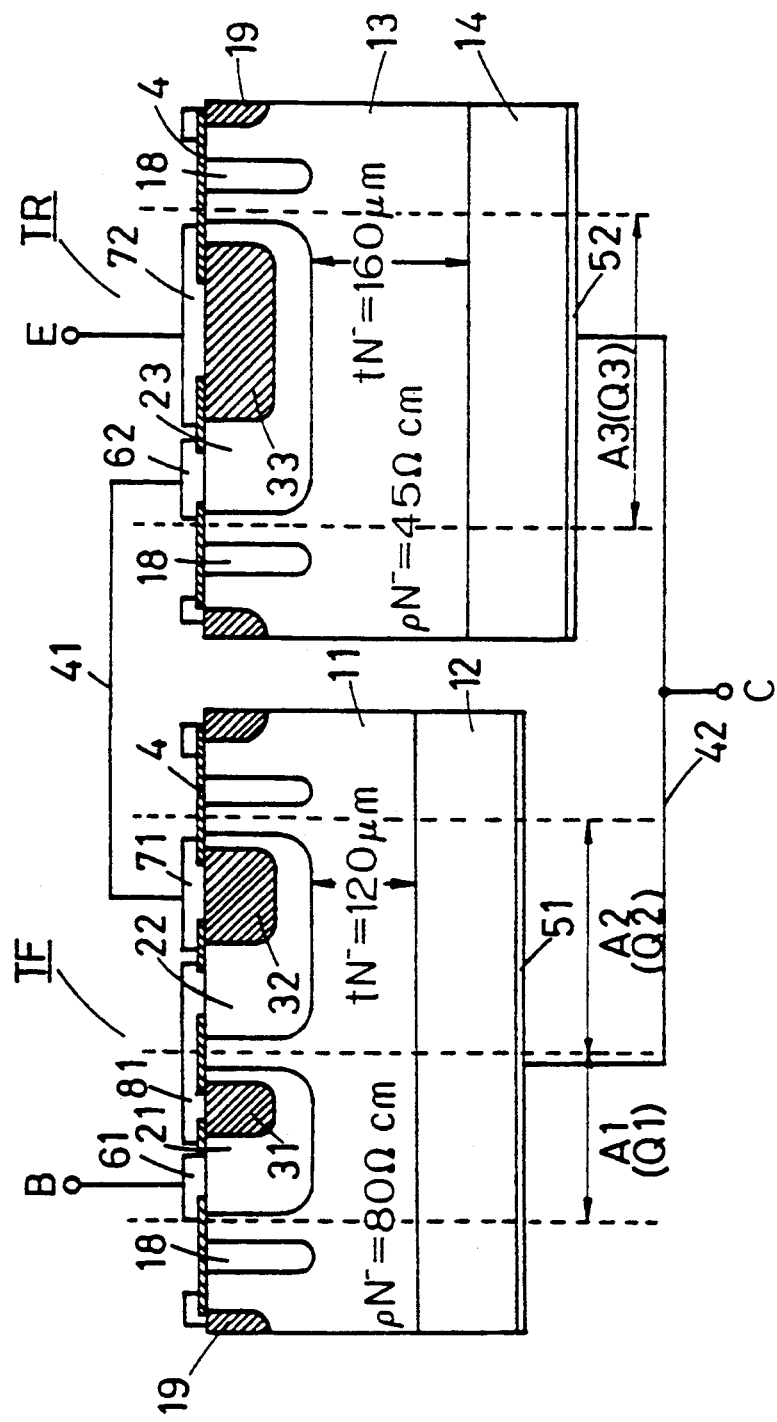
FIG. 8 is a sectional view showing an arrangement of a three-stage Darlington transistor of a first preferred embodiment of the present invention.

FIG. 8 is a sectional view showing an arrangement of a three stage Darlington transistor of the first preferred embodiment. As shown in FIG. 8, in a front stage transistor chip TF, a collector high resistivity layer 11 is formed on a collector low resistivity layer 12. In an upper portion of the collector high resistivity layer 11, a base region 21 of a transistor Q1 is formed in an area A1 while a base region 22 of a transistor Q2 is formed is formed in an area A2, and emitter regions 31 and 32 are selectively formed in a surface of the base regions 21 and 22, respectively. A front stage side collector electrode 51 is formed on a surface of the collector low resistivity layer 12, a front stage side base electrode 61 is formed on the base region 21 of the transistor Q1, a front stage side emitter electrode 71 is formed on the emitter region 32 of the transistor Q2, and a base-emitter connection electrode 81 is formed extending from the emitter region 21 of the transistor Q1 to the base region 22 of the transistor Q2. Reference numerals 4 denotes an oxide film, numeral 18 denotes a girdling, and numeral 19 denotes a channel stop, respectively.

In a rear stage transistor chip TR, on the other hand, the collector high resistivity layer 13 is formed on the collector low resistivity layer 14. In an upper portion of the collector high resistivity layer 13, a base region 23 of a transistor Q3 is formed in an area A3, and an emitter region 33 is selectively formed in a surface of the base region 23. A rear stage side collector electrode 52 is formed on a surface of the collector low resistivity layer 14, a rear stage side base electrode 62 is formed on the base region 23 of the transistor Q3, and a rear stage side emitter electrode 72 is formed on the emitter region 33 of the transistor Q3. Reference numeral 4 denotes an oxide film, numeral 18 denotes a girdling, numeral 19 denotes a channel stop, respectively.

The front stage side emitter electrode 71 and the rear stage side base electrode 62 are electrically connected by wiring 41, while the front stage side collector electrode 51 and the rear stage side collector electrode 52 are electrically connected by wiring 42. Thus, the front stage side base electrode 61 acts as a base electrode of the three stage Darlington transistor, the rear stage side emitter electrode 72 acts as its emitter electrode, and the the front stage side collector electrode 51 and the rear stage side collector electrode 52 act as its collector electrodes.

The collector resistivity $\rho N^-$ in the front stage side transistor chip TF is set to 80 $\Omega$cm while the collector film thickness $tN^-$ is set to 120 $\mu$m, and the collector resistivity $\rho N^-$ in the rear stage side transistor chip TR is set to 45 $\Omega$cm while the collector film thickness $tN^-$ is set to 160 $\mu$m. Thus, the second stage transistor Q2 and the third stage transistor Q3 are transistors which meet <Theory 2> and <Theory 2-1 and Theory 2-2>.

As to the third stage transistor Q3 in the Darlington transistor, the rate r can be expressed as follows;

$$r = \rho N^-(R)/tN^-(R)$$
$$= 45 \, (\Omega\text{cm})/160 \, \mu\text{cm})$$
$$= \text{about } 0.28$$

and the transistor Q3 meets <Theory 1>.

Figure 9:
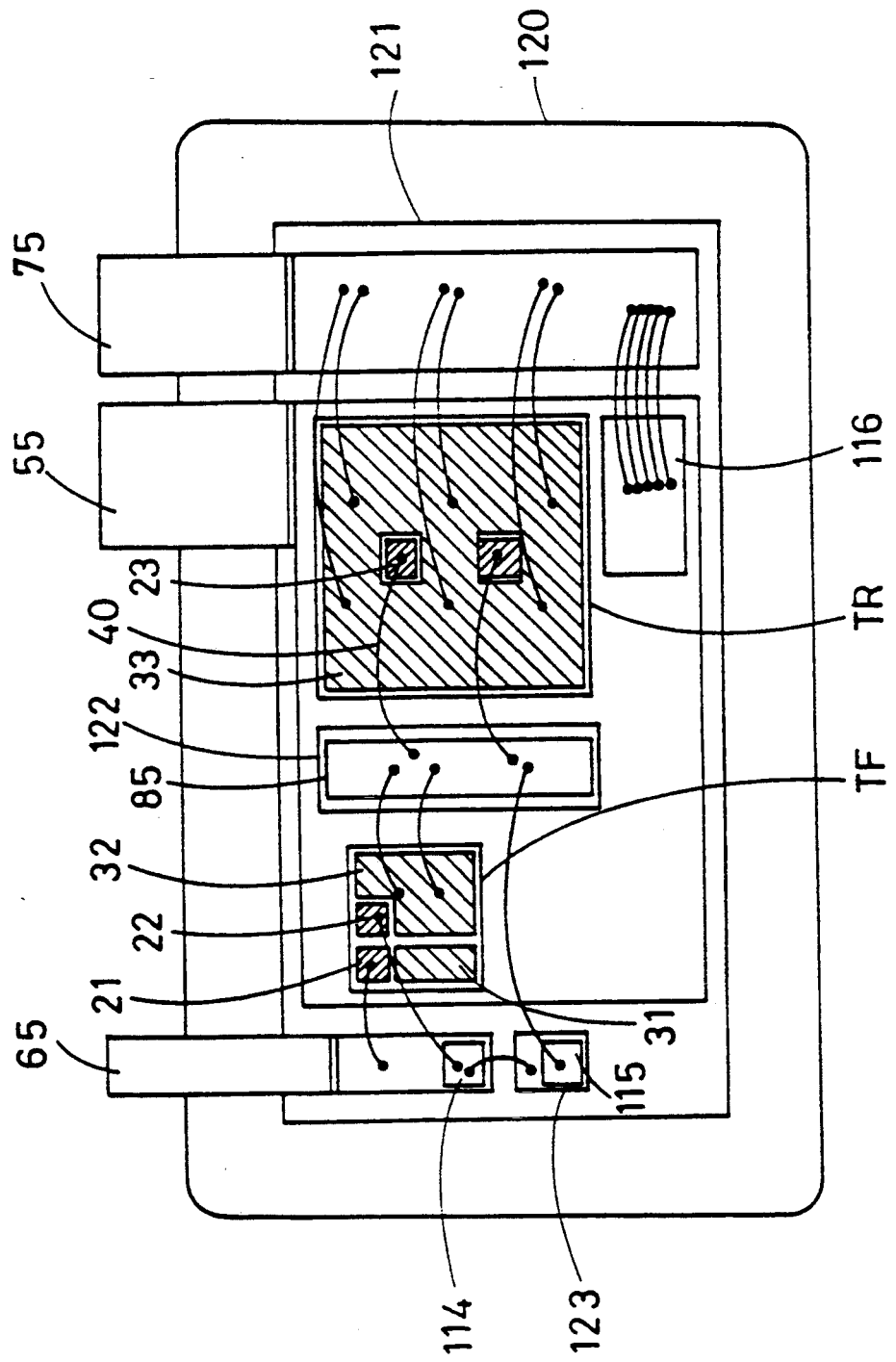
FIG. 9 is a plan view showing the Darlington transistor of the first preferred embodiment which is mounted in a single package.

These two chips TF and TR are mounted in the same package and arranged by wiring in a three-stage Darlington. FIG. 9 is a plan view showing an example of it. As shown in FIG. 9, an insulating substrate 121 is soldered on a metal base substrate 120, and an external extension collector electrode 55, an external extension base electrode 65, an external extension emitter electrode 75, and an auxiliary electrode 123 are separately soldered on the insulating substrate 120.

The front stage transistor chip TF and the rear stage transistor chip TR are soldered on the external extension collector electrode 55, an auxiliary electrode 85 is soldered with the intervening insulating substrate 121, and a fly wheel diode 116 is formed. At this step, the front stage transistor chip TF and the rear stage transistor chip TR are provided with the collector electrodes 51 and 52 on their respective rear sides, and therefore, the external extension collector electrode 55 are electrically connected with the collector electrodes 51 and 52. The fly wheel diode chip 116 has its front face defined as an anode and its rear face defined as a cathode. Thus, the cathode of the fly wheel diode is electrically connected to the external extension collector electrode 55.

A speed-up diode chip 114 is soldered on an external extension base electrode 65 while a speed-up diode chip 115 is soldered on an auxiliary electrode 123. The speed-up diode chips 114 and 115 have their respective front face defined as an anode and their respective rear face defined as a cathode. Thus, the speed-up diode 114 has its cathode electrically connected to the external extension base electrode 65 while the speed-up diode 115 has its cathode electrically connected to the auxiliary electrode 123. In FIG. 9, base electrodes 61 and 62, emitter electrodes 71 and 72, and a base-emitter connecting electrode 81 in FIG. 8 are actually formed but omitted for simplification of the explanation. Thus, the explanation below on the outside of the chip and the wiring will be in the context of the base regions 21 through 23 and the emitter regions 31 through 33 all of which are connected thereto. The external extension base electrode 65 is connected through wiring 40 to the base region 21 of the front stage transistor chip TF, and the emitter region 32 of the front stage transistor chip TF is connected through the wiring 40 to an auxiliary electrode 85.

On the other hand, the rear stage transistor chip TR has its base region 23 connected through the wiring to the auxiliary electrode 85 and its emitter region 33 connected through the wiring 40 to an external extension emitter region 75.

With wiring by the wiring 40, the front stage transistor chip TF and the rear stage transistor chip TR constitute the three-stage Darlington transistor.

The surface of the speed-up diode chip 114 is connected through the wiring 40 to the auxiliary electrode 123 while the surface of the speed-up diode chip 115 is connected through the wiring 40 to the auxiliary electrode 85. As a result, the first stage transistor Q1 and the second stage transistor Q2 have their respective speed-up diodes between their respective base and emitter.

The surface of the fly wheel diode is connected through the wiring 40 to the external extension emitter electrode 75, whereby the fly wheel diode can be provided between the emitter and collector of the third stage transistor Q3.

As previously mentioned, the resistivity of the collector high resistivity layer is about 80 $\Omega$cm in the front side transistor and is about 45 $\Omega$cm in the last stage transistor. BVCEO is about 950 V in the front stage transistor and is about 650 V in the last stage transistor. The total chip area is about 800 mm$^2$, and the rated current in such a voltage class is equivalent to about 150 A.

<4-2. Characteristic of a Device of the First Preferred Embodiment>

Figure 10:
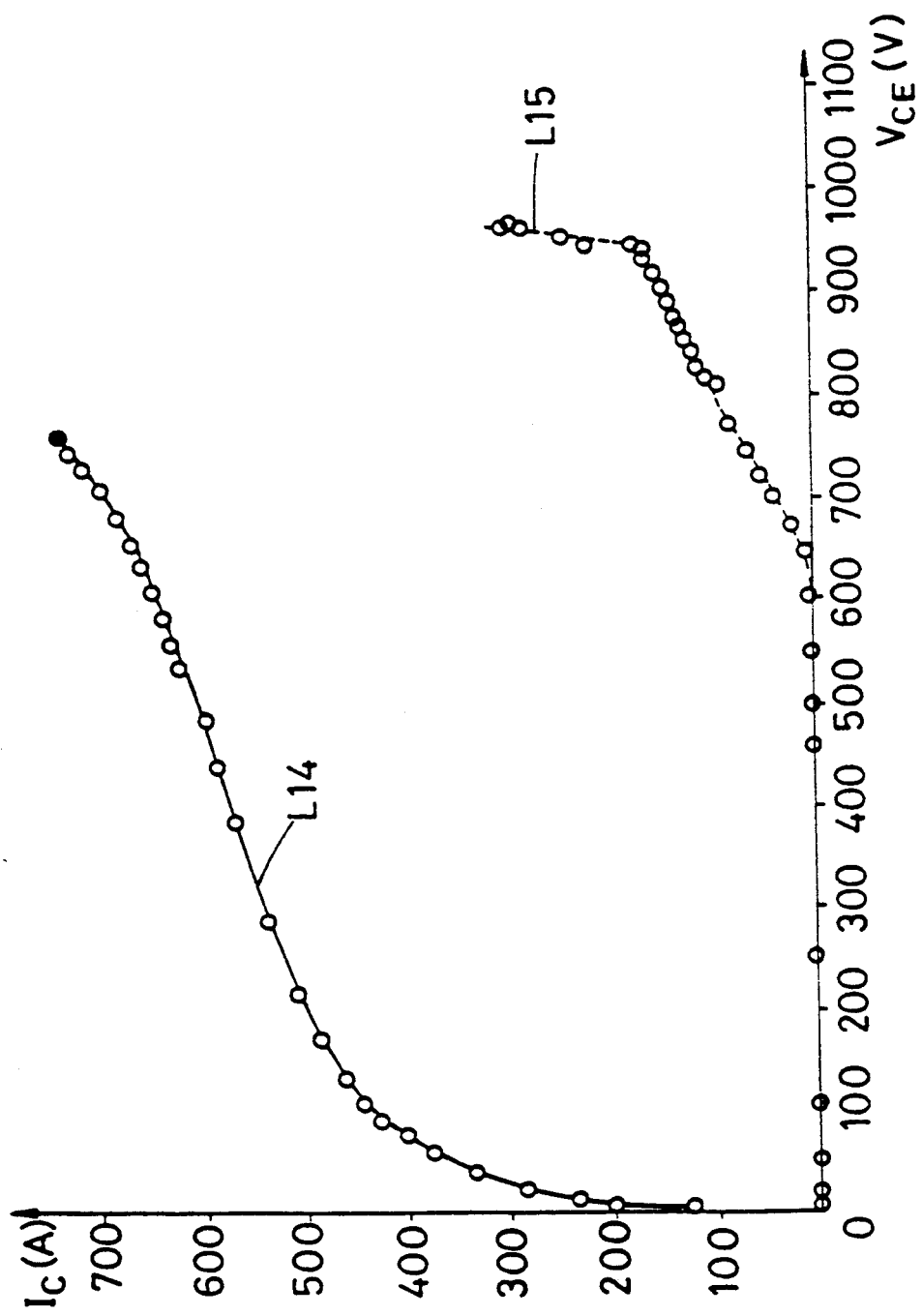
FIG. 10 is a graph of a measurement of a short-circuit endurance limit of a Darlington transistor.

As to this transistor, FIG. 10 shows an example of measurement of the endurance limit against short-circuit similar to FIG. 6. In FIG. 10, a curve L14 represents a case where the base current IB1 is at an ordinary level while a curve L15 represents a case where the base current IB1 is at a minute level.

In the measurement with the base current extremely small, as shown by the curve L15, the collector current linearly increases from a point slightly over voltage about 650 V which is equivalent to BVCEO of the rear stage until a point about 950 V which is equivalent to BVCEO of the front stage. A drastic increase in the collector current occurs after that.

For a period during which the collector current linearly increases, it will be recognized that the front stage does not operate but the rear stage alone permits current to flow. When supply voltage reaches about 950 V equivalent to BVCEO of the front stage, breakdown is caused between the collector and emitter of the front stage, and the current generated makes an action as the base current upon the rear stage, and thus, the drastic current increase arises.

As has been described, in the transistor according to the present invention, in some way a short-circuit protection mechanism for reducing the collector current can be used up to the voltage value of BVCEO of the front stage.

When both the front and rear stages present tN$^-$=about 140 $\mu$m, the current amplification factor hFE=about 200 under the collector current of 150 A in the transistor shown in FIG. 45 while when the front stage presents tN$^-$(F)=about 120 $\mu$m and the rear stage presents tN$^-$(R)=about 140 $\mu$m, hFE=about 700 under the collector current 150A. When the collector film thickness tN$^-$(F) is made smaller, a value of the base opening breakdown voltage BVCEO is decreased, but making the collector resistivity $\rho$N$^-$(F) high can prevent a reduction of the value of the breakdown voltage.

As to the rear stage, the resistivity $\rho$N$^-$ of the collector high resistivity layer is reduced and r <0.6 is satisfied as to the rate r (similar to the case of FIG. 1), the endurance limit against breakdown under high voltage can be improved sharply.

<4-3. Method of Manufacturing a Device of the First Preferred Embodiment>

A method of manufacturing a three-stage Darlington transistor in the first preferred embodiment will be described.

First, a method of forming a collector high resistivity layer will be described.

Figure 11:
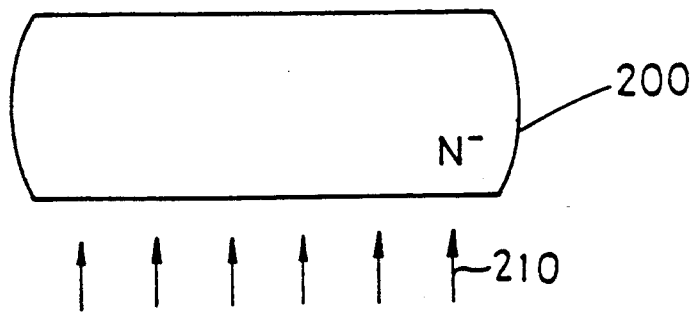
FIG. 11 is a diagram showing a method of manufacturing the Darlington transistor the of first preferred embodiment.

As shown in FIG. 11, a Si (silicon) monocrystal rod 200 is exposed to neutrons 210 to cause a nuclear reaction of part of Si into N-type atoms. At this time, the resistivity of the collector high resistivity layer can be formed with high accuracy by controlling the quantity of irradiated neutrons determined by a density and irradiation time of the neutrons 210.

Figure 12:
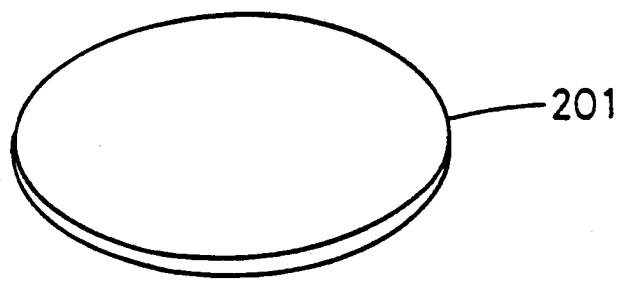
FIG. 12 is a diagram showing a method of manufacturing the Darlington transistor of the first preferred embodiment.
Figure 13:
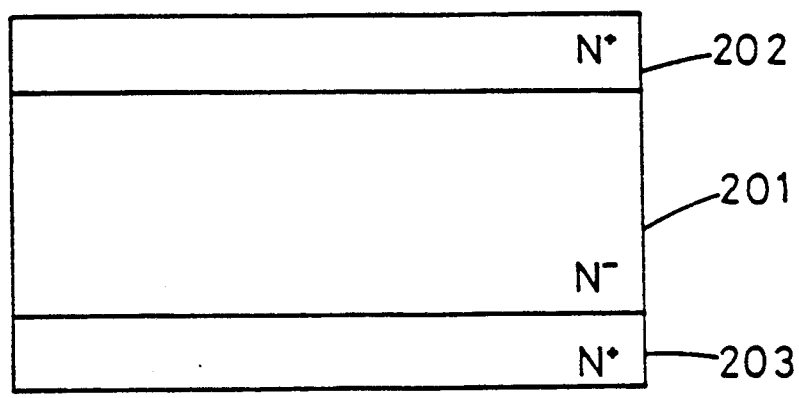
FIG. 13 is a sectional view showing a method of manufacturing the Darlington transistor of the first preferred embodiment.

The Si monocrystal rod 200 to which N-type impurity has already been added is sliced into wafers like a wafer 201 as shown in FIG. 12. The wafer 201 is used as an N⁻ type semiconductor substrate, and the N-type impurity is implanted into its front and rear surfaces to form N+ layers 202 and 203 of high N-type impurity concentration in the front and rear surfaces of the semiconductor substrate 201 as shown in FIG. 13.

Figure 14:
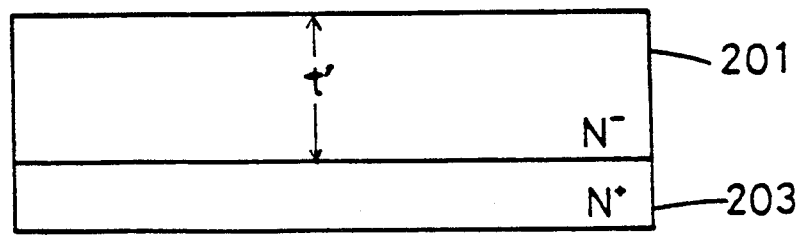
FIG. 14 is a sectional view showing a method of manufacturing the Darlington transistor of the first preferred embodiment.

The laminated layers are accurately cut off from a major surface of the N+ layer 202 to the N-type semiconductor substrate 201, and consequently, a film thickness t' of the remaining semiconductor substrate 201 which is to act as a collector high resistivity layer can be accurately determined, as shown in FIG. 14. Also, the N+ layer 203 is to act as a collector low resistivity layer.

In this way, an accurate resistivity and film thickness off the collector high resistivity layer can be attained. All that are required as a first method of making a collector high resistivity layer have been described.

Figure 15:
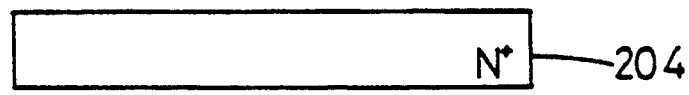
FIG. 15 is a sectional view showing a method of manufacturing the Darlington transistor of the first preferred embodiment.
Figure 16:
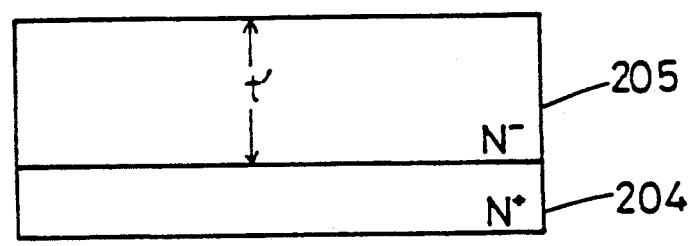
FIG. 16 is a sectional view showing a method of manufacturing the Darlington transistor of the first preferred embodiment.

Now there will be described a second method of making a collector high resistivity layer. First, as shown in FIG. 15, an N+ semiconductor substrate (N+ wafer) 204 which is to act as a collector low resistivity layer is prepared, and as shown in FIG. 16, an N⁻ layer 205 which is to act as a collector high resistivity layer is formed by epitaxial growing on the surface of the N+ semiconductor substrate (N+ wafer) 204. At this time, an accurate film thickness t' and resistivity of the N⁻ layer 205 must be attained.

Figure 17:
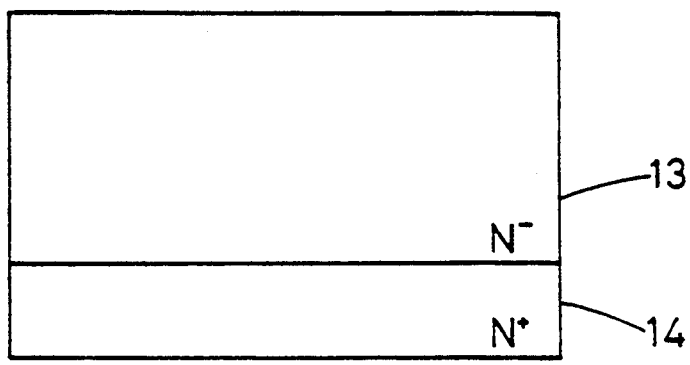
FIG. 17 is a sectional view showing a method of manufacturing the Darlington transistor of the first preferred embodiment.

By the above-mentioned first or second method of making a collector high resistivity layer, a collector high resistivity layer 13 which is relatively large in film thickness $((160+\alpha)\mu m)$ and relatively low in resistivity (45 Ω cm) and a collector low resistivity layer 14 are formed on a first chip, as shown in FIG. 17. A method of manufacturing a transistor on the first chip which is to act as a rear stage transistor chip will be described below.

Figure 19:
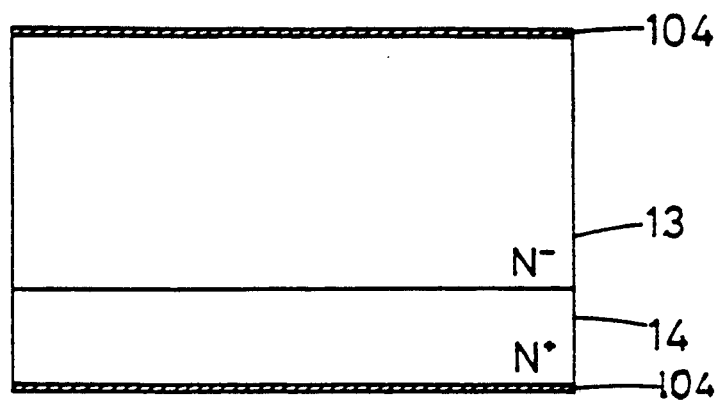
FIG. 19 is a sectional view showing a method of manufacturing the Darlington of the first preferred embodiment.
Figure 20:
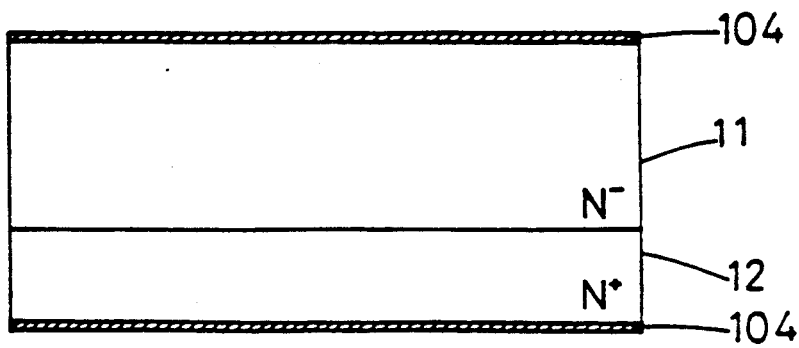
FIG. 20 is a sectional view showing a method of manufacturing the Darlington transistor of the first preferred embodiment.

First, as shown in FIG. 19, An oxide film 104 is formed by a thermal oxidation method on surfaces of the collector high resistivity layer 13 and the collector low resistivity layer 14, respectively.

Figure 21:
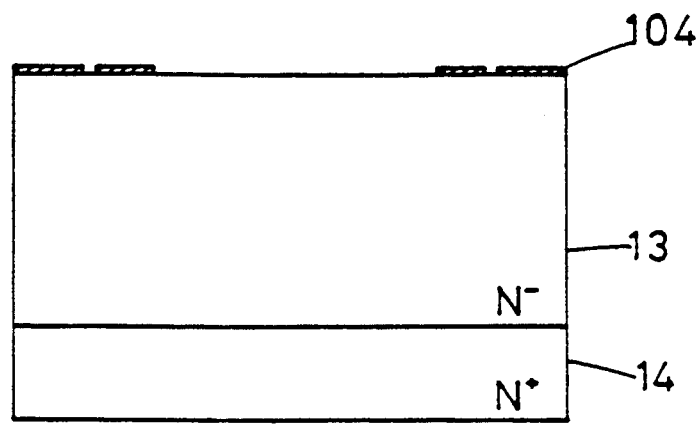
FIG. 21 is a sectional view showing a method of manufacturing the Darlington transistor of the first preferred embodiment.

Then, as shown in FIG. 21, the oxide film 104 formed on the surface of the collector high resistivity layer 13 is patterned by photolithography. At this step, the oxide film 104 formed on the surface of the collector low resistivity layer 14 is completely removed.

Figure 23:
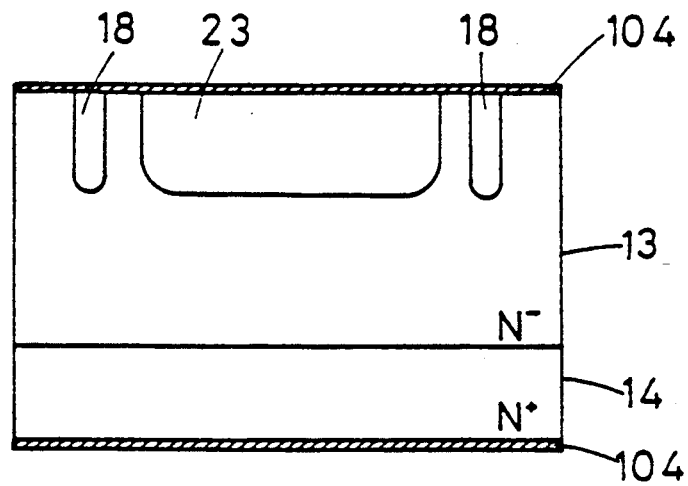
FIG. 23 is a sectional view showing a method of manufacturing the Darlington of the first preferred embodiment.

Furthermore, as shown in FIG. 23, by means of ion implantation of P-type impurity or by means of diffusion in a impurity containing gas, the P-type impurity is introduced in the surface of the collector high resistivity layer 13 and diffused up to a depth $\alpha$ in the oxidizing atmosphere to form a base region 23 and a girdling 18. As a result, the collector film thickness tN⁻(R) becomes 160 $\mu$m. At this time, the oxide film 104 is formed on the collector high resistivity layer 13 and the collector low resistivity layer 14.

Figure 25:
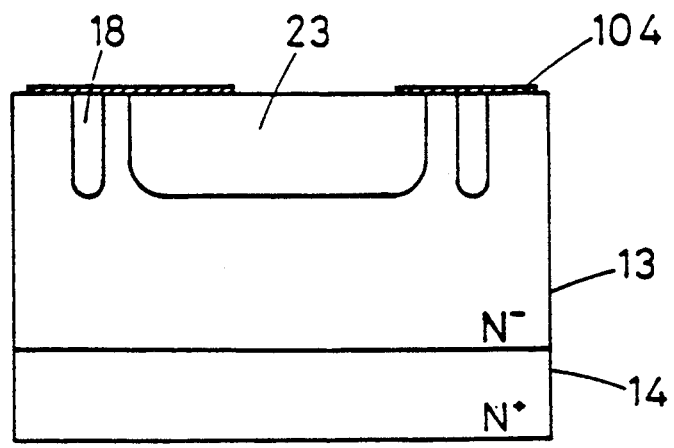
FIG. 25 is a sectional view showing a method of manufacturing the Darlington transistor of the first preferred embodiment.

Then, as shown in FIG. 25, the oxide film 104 formed on the surface of the collector high resistivity layer 13 is patterned by photolithography. At this time, the oxide film 104 formed on the surface of the collector low resistivity layer 14 is completely removed.

Figure 27:
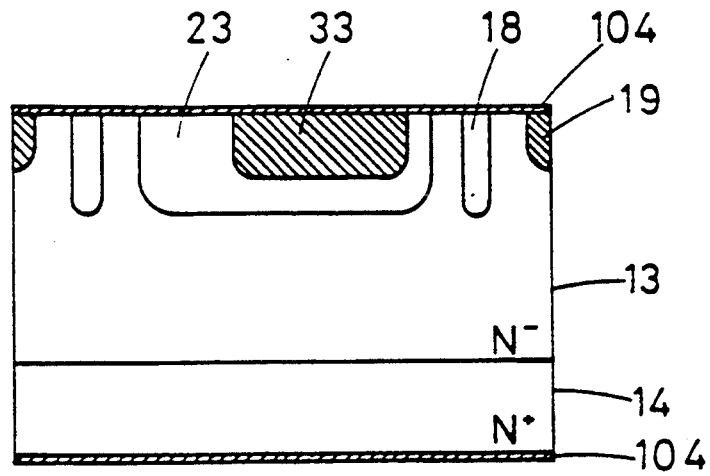
FIG. 27 is a sectional view showing a method of manufacturing the Darlington transistor of the first preferred embodiment.

Moreover, as shown in FIG. 27, N-type impurity is introduced in the surface of the collector high resistivity layer 13 and diffused up to a specified depth $\beta(<\alpha)$ in the oxidizing atmosphere to form a emitter region 33 and a channel stop 19. At this time, the oxide film 104 is formed on the surfaces of the collector high resistivity layer 13 and the collector low resistivity layer 14.

Figure 29:
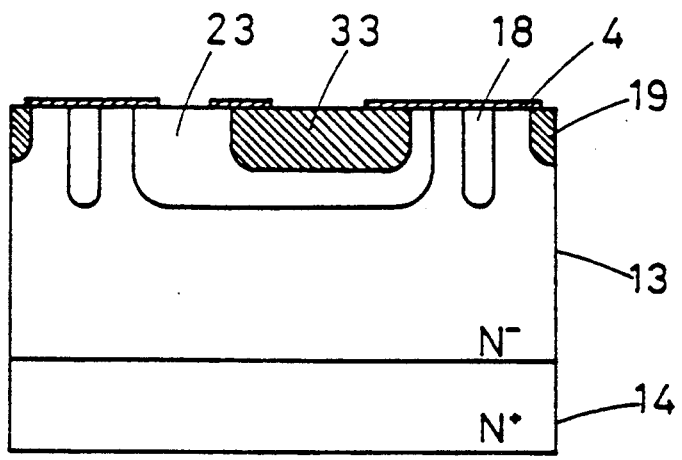
FIG. 29 is a sectional view showing a method of manufacturing the Darlington transistor of the first preferred embodiment.

Then, as shown in FIG. 29, the oxide film 104 formed on the surface of the collector high resistivity layer 13 is patterned by photolithography. The oxide film 104 patterned in this way is to act as the oxide film 4 of FIG. 8. At this time, the oxide film 104 formed on the surface of the collector low resistivity layer 14 is completely removed.

Figure 31:
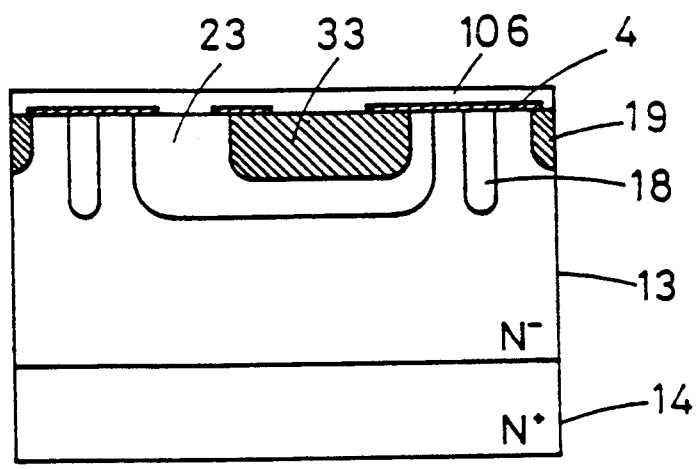
FIG. 31 is a sectional view showing a method of manufacturing the Darlington transistor of the first preferred embodiment.

After that, as shown in FIG. 31, a metal layer 106 is formed over the whole surface of the collector high resistivity layer 13 by means of vapor deposition, spattering, etc.

Next, as shown in FIG. 33, the metal layer 106 is patterned by photolithography to form a rear stage base electrode 62 and a rear stage emitter electrode 72.

Figure 35:
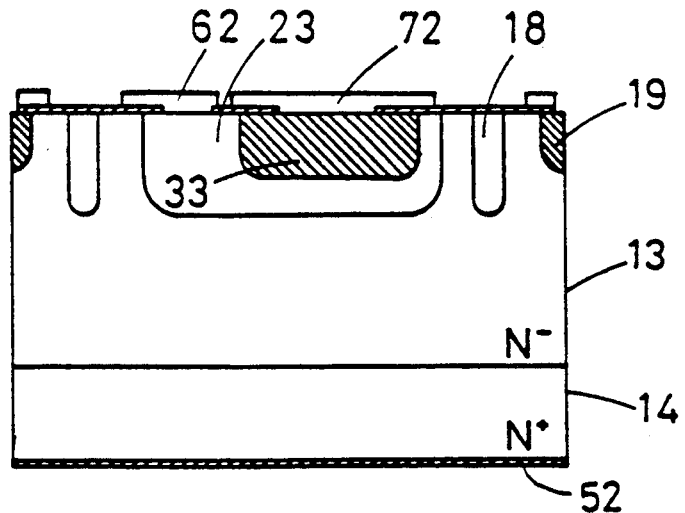
FIG. 35 is a sectional view showing a method of manufacturing the Darlington transistor of the first preferred embodiment.

After that, as shown in FIG. 35, a metal layer which is to act as a collector electrode 52 is formed over the whole surface of the collector low resistivity layer 14, and thus, the rear stage transistor is completed.

Figure 18:
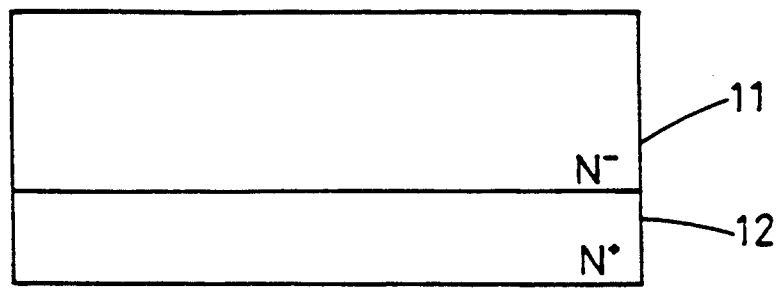
FIG. 18 is a sectional view showing a .method of manufacturing the Darlington transistor of the first preferred embodiment.

On the other hand, by the above-mentioned first or second method of making a collector high resistivity layer, a collector high resistivity layer 11 which is relatively, small in film thickness $((120+\alpha)\mu m)$ and relatively high in resistivity (80 Ωcm) and a collector low resistivity layer 12 are formed on a second chip different from the first chip, as shown in FIG. 18. A method of manufacturing a transistor on the second chip which is to act as a front stage transistor chip will be described below.

First, as shown in FIG. 29, the oxide film 104 is formed on surfaces of the collector high resistivity layer 11 and the collector low resistivity layer 12 by thermal oxidation.

Figure 22:
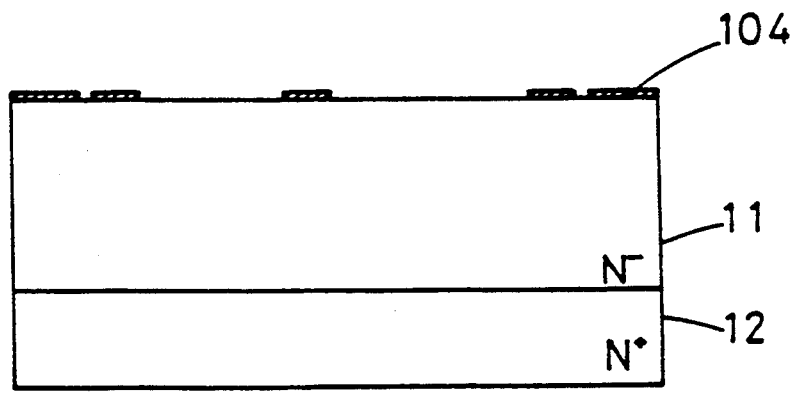
FIG. 22 is a sectional view showing a method of manufacturing the Darlington transistor of the first preferred embodiment.

Then, as shown in FIG. 22, the oxide film 104 formed on the surface of the collector high resistivity layer 11 is patterned by photolithography. At this time, the oxide film 104 formed on the collector low resistivity layer 12 is completely removed.

Figure 24:
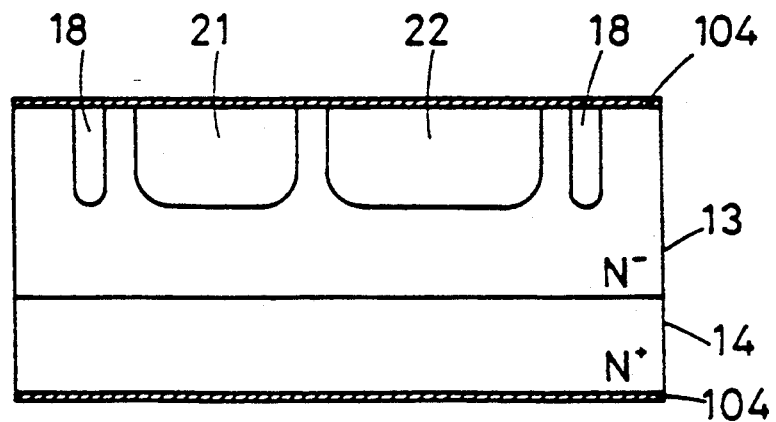
FIG. 24 is a sectional view showing a method of manufacturing the Darlington transistor of the first preferred embodiment.

After that, as shown in FIG. 24, by means of ion implantation of P-type impurity or by means of diffusion in a impurity containing gas, the P-type impurity is introduced in the surface of the collector high resistivity layer 11 and diffused up to a depth $\alpha$ in the oxidizing atmosphere to form base regions 21, 22 and a girdling 18. As a result, a collector film thickness tN⁻(F) becomes 120 $\mu$m. At this step, the oxide film 104 is formed on the surfaces of the collector high resistivity layer 11 and the collector low resistivity layer 12.

Figure 26:
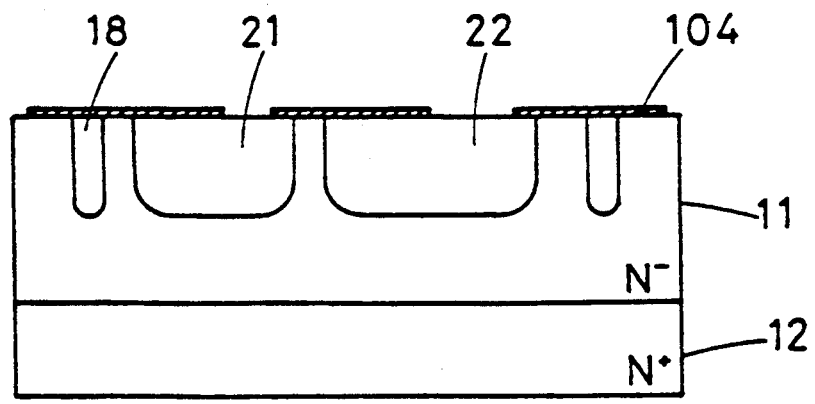
FIG. 26 is a sectional view showing a method of manufacturing the Darlington transistor of the first preferred embodiment.

Next, as shown in FIG. 26, the oxide film 104 formed on the surface of the collector high resistivity layer 11 is patterned by photolithography. At this step, the oxide film 104 formed on the surface of the collector low resistivity layer 12 is completely removed.

Figure 28:
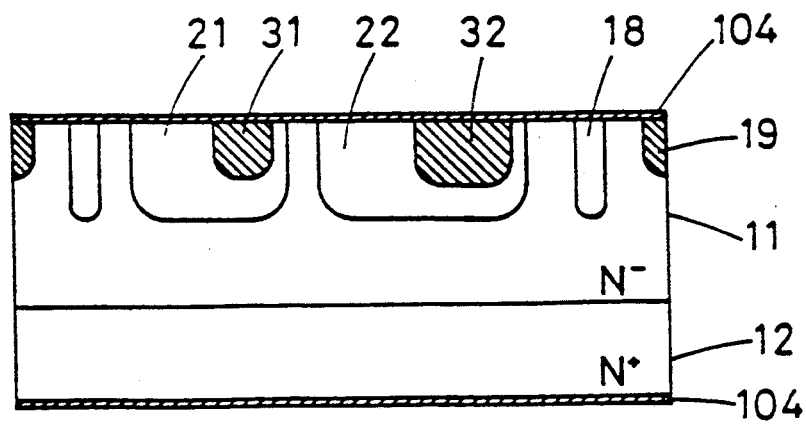
FIG. 28 is a sectional view showing a method of manufacturing the Darlington transistor of the first preferred embodiment.

Then, as shown in FIG. 28, N-type impurity is introduced in the surface of the collector high resistivity layer 11 and diffused up to a depth $\beta(<\alpha)$ in the oxidizing atmosphere to form emitter regions 31, 32 and a channel stop 19. At this step, the oxide film 104 is formed on the surfaces of the collector high resistivity layer 11 and the collector low resistivity layer 12.

Figure 30:
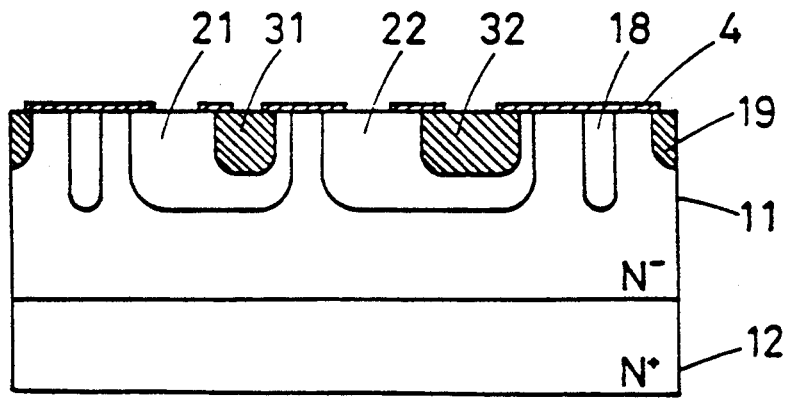
FIG. 30 is a sectional view showing a method of manufacturing the Darlington transistor of the first preferred embodiment.

Furthermore, as shown in FIG. 30, the oxide film 104 formed on the surface of the collector high resistivity layer 11 is patterned by photolithography. The oxide film 104 patterned in this way is to act as the oxide film 4 of FIG. 8. At this step, the oxide film 10 formed on the surface of the collector low resistivity layer 12 is completely removed.

Figure 32:
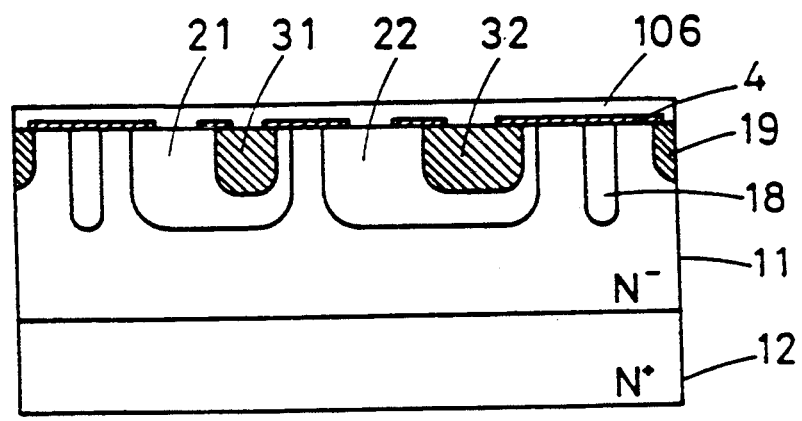
FIG. 32 is a sectional view showing a method of manufacturing the Darlington transistor of the first preferred embodiment.

Then, as shown in FIG. 32, by means of vapor deposition, spattering, etc., a metal layer 106 is formed over the whole surface of the collector high resistivity layer 11.

Moreover, as shown in FIG. 34, the metal layer 106 is patterned by photolithography to form a front base electrode 62, a base-emitter connecting electrode 81, and a front stage emitter electrode 72.

Figure 36:
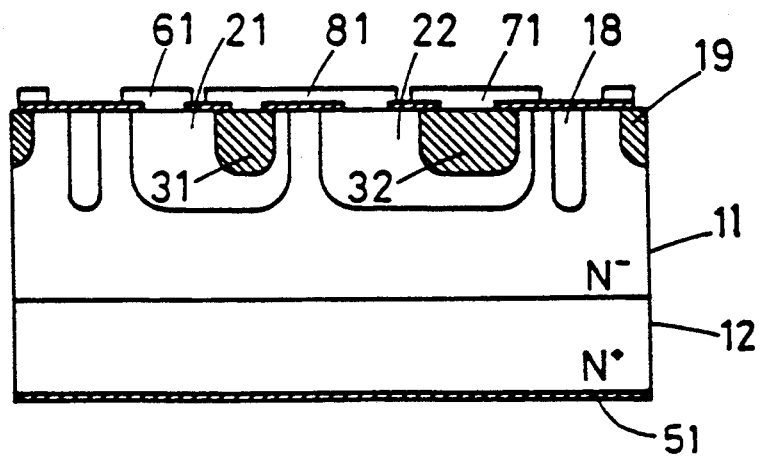
FIG. 36 is a sectional view showing a method of manufacturing the Darlington transistor of the first preferred embodiment.

After that, as shown in FIG. 36, a metal layer which is to act as a collector electrode 51 is formed over the whole surface of the collector low resistivity layer 12, and thus, the front stage transistor is completed.

In the front and rear stage transistors made in this way, the front side emitter electrode 71 and the rear stage side base electrode 62 are electrically connected by wiring 41 while the front stage side collector electrode 51 and the rear stage side collector electrode 52 are electrically connected by wiring 42, and thus, the three-stage Darlington transistor of the first preferred embodiment shown in FIG. 8 is completed.

<41 -4. Arrangement of a Device of a Second Preferred Embodiment>

A Darlington transistor of a second preferred embodiment is equivalent to a case where:

M=2, m=1

Figure 37:
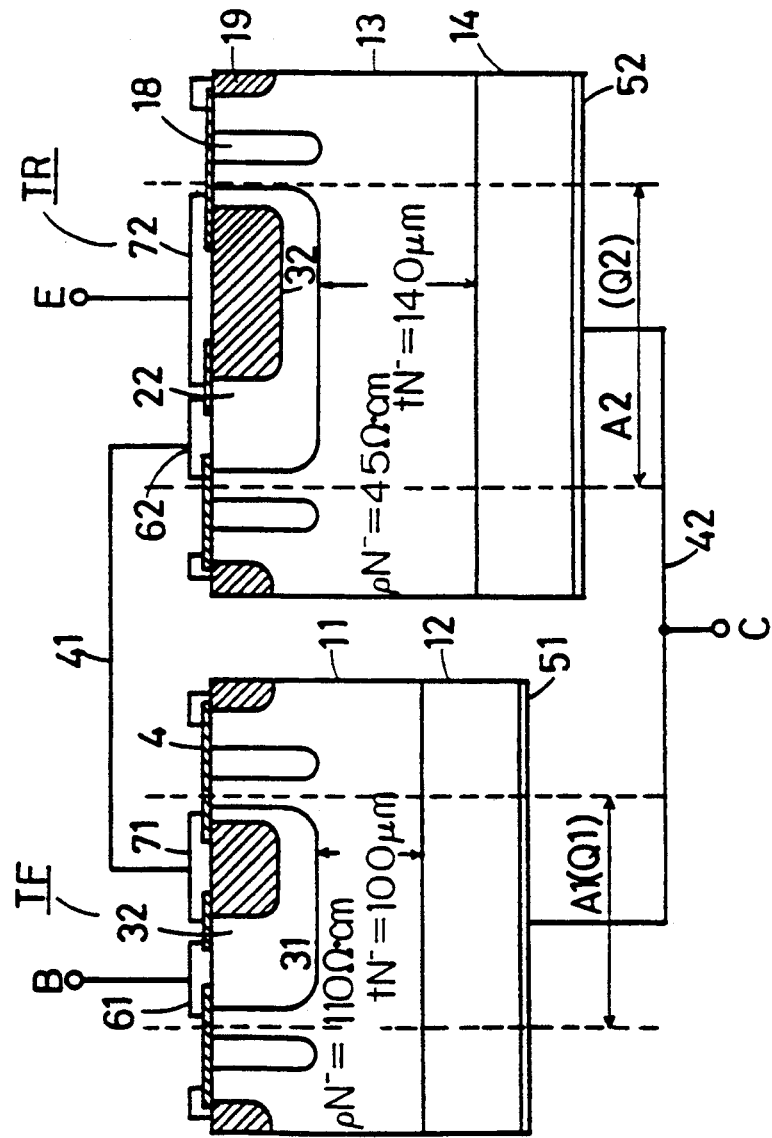
FIG. 37 is a sectional view showing an arrangement of a two-stage Darlington transistor of a second preferred embodiment.

FIG. 37 is a sectional view showing an arrangement of a second stage Darlington transistor of the second preferred embodiment. As shown in FIG. 37, in a front stage transistor chip TF, a collector high resistivity layer 11 is formed on a collector low resistivity layer 12. A base region 21 of a transistor Q1 is formed in an area A1 of an upper portion of the collector high resistivity layer 11 while an emitter region 31 is selectively formed on a surface of a base region 21. Moreover, a front stage side collector electrode 51 is formed on a surface of the collector low resistivity layer 12, a front stage side base electrode 61 is formed on the base region 21 of the transistor Q1, and a front stage side emitter electrode 71 is formed on the emitter region 31 of the transistor 01. Reference numeral 4 denotes an oxide film, numeral 18 denotes a girdling, and numeral 19 denotes a channel stop, respectively.

On the other hand, in a rear stage transistor chip TR, a collector high resistivity layer 13 is formed on a collector low resistivity layer 14. a base region 22 of a transistor Q2 is formed in an area A2 of an upper portion of the collector high resistivity layer 13, and an emitter region 32 is selectively formed in a surface of the base region 22. Furthermore, a rear stage side collector electrode 52 is formed on the surface of the collector low resistivity layer 14, a rear stage side base electrode 62 is formed on the base region 22 of the transistor Q2, and a rear stage side emitter electrode 72 is formed on the emitter region 32 of the transistor Q2. Reference numeral 4 denotes an oxide film, numeral 18 denotes a girdling, and numeral 19 denotes a channel step, respectively.

The front stage side emitter electrode 71 and the rear stage side base electrode 62 are electrically connected by wiring 41 while the front stage side collector electrode 51 and the rear stage side collector electrode 52 are electrically connected by wiring 42. Thus, the front stage side base electrode 61 acts as a base electrode of the second-stage Darlington transistor, the rear stage side emitter electrode 72 acts as its emitter electrode, and the front stage side collector electrode 51 and the rear stage side collector electrode 52 act as its collector electrode.

In the front stage side transistor chip TF, a collector resistivity $\rho N^-$ of the collector high resistivity layer 11 is set to 110 $\Omega$cm and its collector film thickness $tN^-$ is set to 100 $\mu$m, and in the rear stage transistor chip TR, a collector resistivity $\rho N^-$ of the collector high resistivity layer 13 is set to 45 $\Omega$cm and its collector film thickness $tN^-$ is set to 160 $\mu$m. Thus, the transistor Q1 of the first stage and the transistor Q2 of the second stage meet <Theory 2>.

A transistor which meets <Theory 1> is the second stage transistor Q2 (r=45/160=about 0.28).

<4-5. Method of Manufacturing a Device of the Second Preferred Embodiment>

Similar to the first preferred embodiment, the front stage side transistor chip TF and the rear stage side transistor chip TR are separately fabricated.

<4-6. Arrangement of a Device of a Third Preferred Embodiment>

A Darlington transistor of a third preferred embodiment is equivalent to a case where:

M=3, m=1

Figure 38:
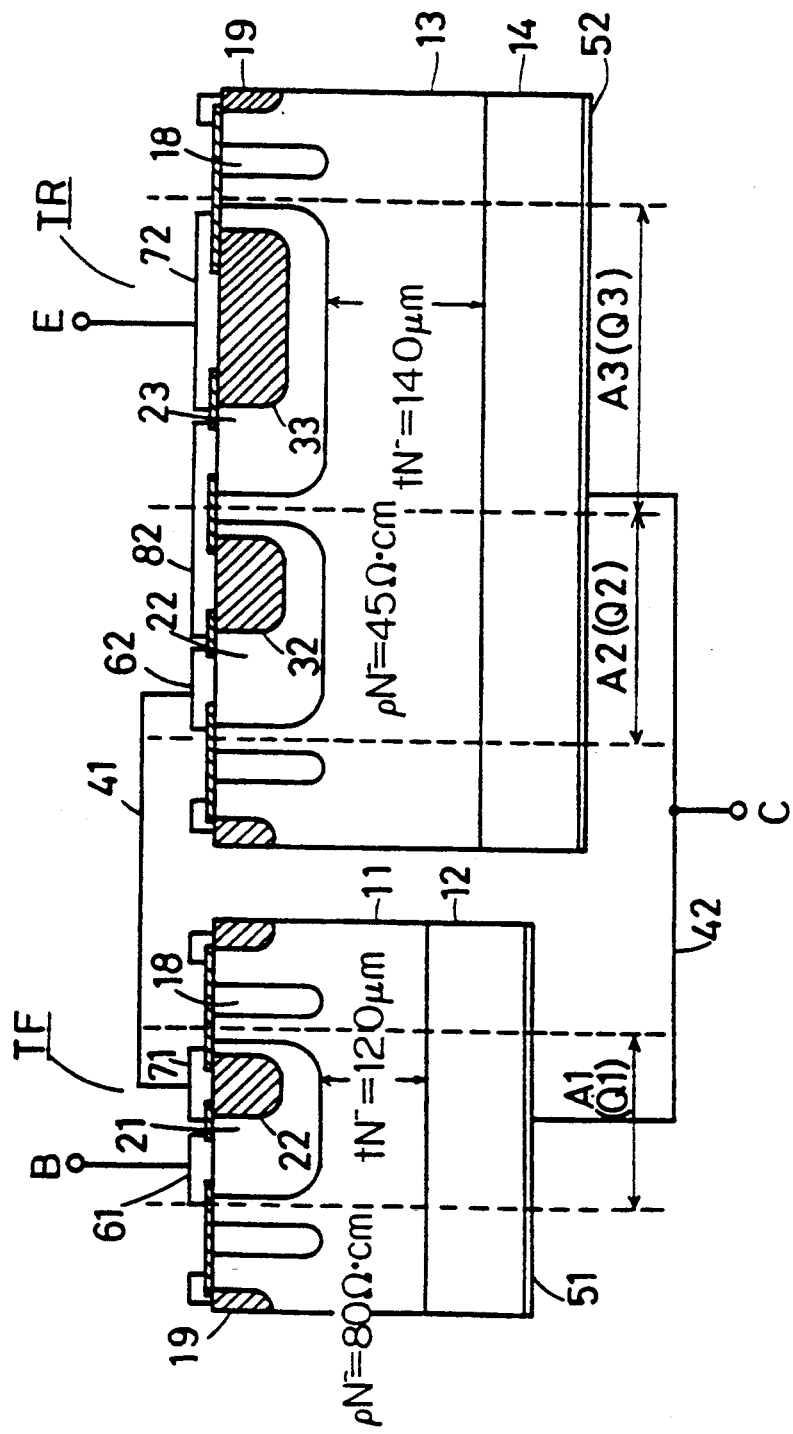
FIG. 38 is a sectional view showing an arrangement of a three-stage Darlington transistor of a third preferred embodiment.

FIG. 38 is a sectional view showing an arrangement of a three-stage Darlington transistor of the third preferred embodiment. As shown in FIG. 38, in a front stage transistor chip TF, a collector high resistivity layer 11 is formed on a collector low resistivity layer 12. A base region 21 of a transistor Q1 is formed in an area A1 of an upper portion of the collector high resistivity layer 11 while an emitter region 31 is selectively formed in a surface of the base region 21. Then, a front stage side collector electrode 51 is formed on a surface of the collector low resistivity layer 12, a front stage side base electrode 61 is formed on the base region 21 of the transistor Q1, and a front stage side emitter electrode 71 is formed on the emitter region 31 of the transistor Q1. Reference numeral 4 denotes an oxide film, numeral 18 denotes a girdling, and numeral 19 denotes a channel stop.

On the other hand, in a rear stage side transistor chip TR, a collector high resistivity layer 13 is formed on a surface of a collector low resistivity layer 14. Base regions 22 and 23 of the transistors Q2 and Q3 are formed in areas A2 and A3 of an upper portion of the collector high resistivity layer 13, respectively, and emitter regions 32 and 33 are selectively formed on surfaces of the base regions 22 and 23. Then, a rear stage side collector electrode 52 is formed on the surface of the collector low resistivity layer 14, a rear stage side base electrode 62 is formed on the base region 22 of the transistor Q2, a rear stage side emitter electrode 72 is formed on the emitter region 33 of the transistor Q3, and a base-emitter connecting electrode 82 is formed over from the emitter region 32 of the transistor Q2 to the base region 23 of the transistor Q3. Reference numeral 4 denotes an oxide film, numeral 18 denotes a girdling, numeral 19 denotes a channel stop, respectively.

The front stage side emitter electrode 71 and the rear stage side base electrode 62 are electrically connected by wiring 41 while the front stage side collector electrode 51 and the rear stage side collector electrode 52 are electrically connected by wiring 42. Thus, the front stage side base electrode 61 acts as a base electrode of a three-stage Darlington transistor, the rear stage side emitter electrode 72 acts as an emitter electrode, and the front stage side collector electrode 51 and the rear stage side collector electrode 52 act as collector electrodes.

In the front stage side transistor chip TF, a collector resistivity $\rho N^-$ of the collector high resistivity layer 11 is set to 80 $\Omega$cm and its collector film thickness $tN^-$ is set to 120 $\mu$m, and in the rear stage transistor chip TR, a collector resistivity $\rho N^-$ of the collector high resistivity layer 13 is set to 45 $\Omega$cm and its collector film thickness $tN^-$ is set to 140 $\mu$m. Thus, the transistor Q1 of the first stage and the transistor Q2 of the second stage meet <Theory 2>.

A transistor which meets <Theory 1> is a two-stage transistor Q2 or three-stage transistor Q3 (r=45/140=about 0.32).

<4-7. Method of Manufacturing a Device of the Third Preferred Embodiment>
Similar to the first preferred embodiment, the front stage side transistor chip TF and the rear stage side transistor chip TR are separately manufactured.

<4-8. Arrangement of a Device of a Fourth Preferred Embodiment>
A Darlington transistor of a fourth preferred embodiment is equivalent to a case where:

M=4, m=3

Figure 39:
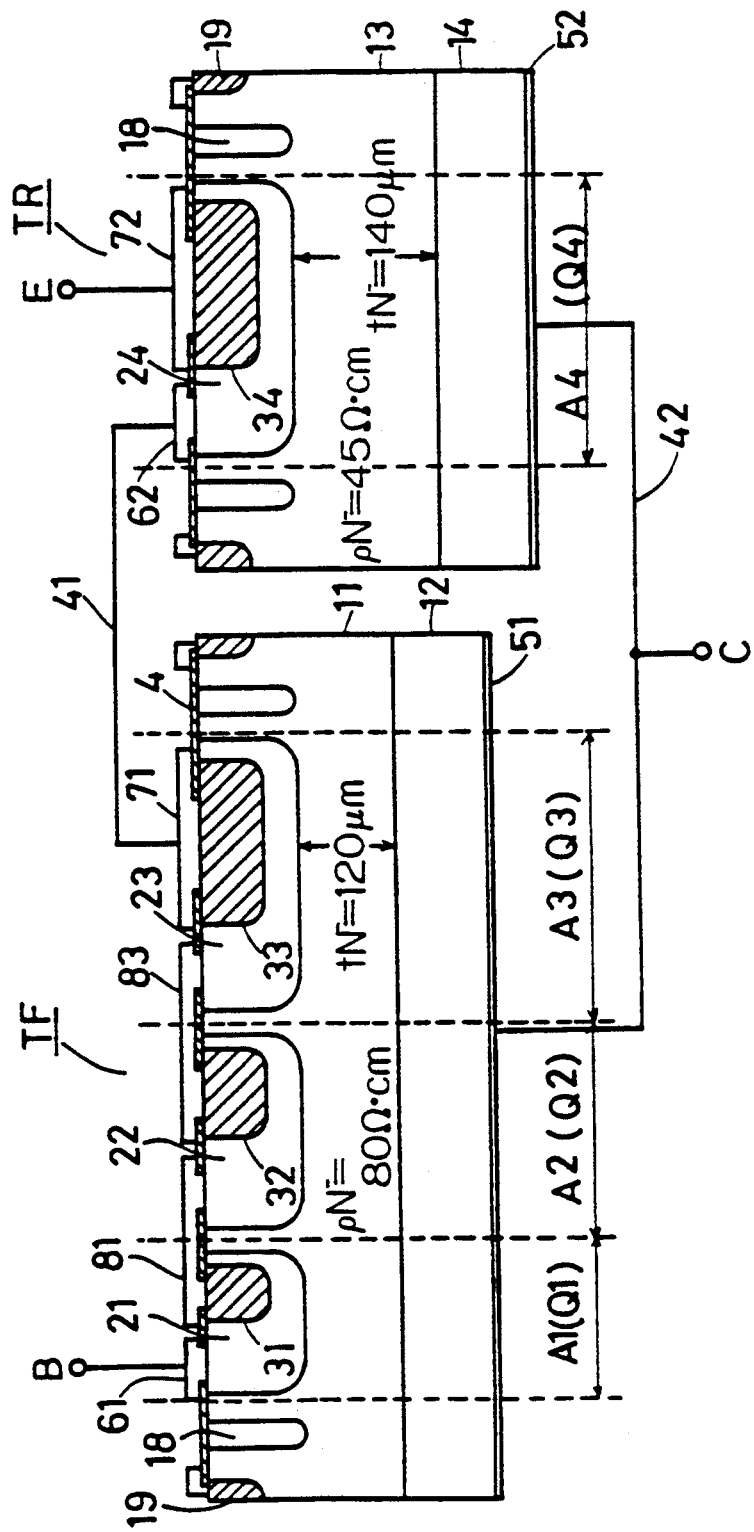
FIG. 39 is a sectional view showing an arrangement of a four-stage Darlington transistor of a fourth preferred embodiment.

FIG. 39 is a sectional view showing an arrangement of a four-stage Darlington transistor of the fourth preferred embodiment. As shown in FIG. 39, in a front stage transistor chip TF, a collector high resistivity layer 11 is formed on a collector low resistivity layer 12. Base regions 21 through 23 of transistors Q1 through Q3 are formed in areas A1 through A3 of an upper portion of the collector high resistivity layer 11 while emitter regions 31 through 33 are selectively formed in surfaces of the base regions 21 through 23. Moreover, a front stage side collector electrode 51 is formed on a surface of the collector low resistivity layer 12, a front stage side base electrode 61 is formed on the base region 21 of the transistor 01, a front stage side emitter electrode 71 is formed on the emitter region 33 of the transistor Q3, a base-emitter connecting electrode 81 is formed over from the emitter region 31 of the transistor Q1 to the base region 22 of the transistor 02, and a base-emitter connecting electrode 83 is connected over from the emitter region 32 of the transistor Q2 to the base region 23 of the transistor 03. Reference numeral 4 denotes an oxide film, numeral 18 denotes a girdling, and numeral 19 denotes a channel stop, respectively.

On the other hand, in a rear stage side transistor chip TR, a collector high resistivity layer 13 is formed on a surface of a collector low resistivity layer 14. A base region 24 of a transistors Q4 is formed in an area A4 of an upper portion of the collector high resistivity layer 13, and an emitter region 34 is selectively formed on a surface of the base region 24. Then, a rear stage side collector electrode 52 is formed on the surface of the collector low resistivity layer 14, a rear stage side base electrode 62 is formed on the base region 24 of the transistor 04, a rear stage side emitter electrode 72 is formed on the emitter region 34 of the transistor Q4. Reference numeral 4 denotes an oxide film, numeral 18 denotes a girdling, numeral 19 denotes a channel stop, respectively.

The front stage side emitter electrode 71 and the rear stage side base electrode 62 are electrically connected by wiring 41 while the front stage side collector electrode 51 and the rear stage side collector electrode 52 are electrically connected by wiring 42. Thus, the front stage side base electrode 61 acts as a base electrode of a four-stage Darlington transistor, the rear stage side emitter electrode 72 acts as an emitter electrode, and the front stage side collector electrodes 51 and the rear stage side collector electrode 52 act as collector electrodes. In the front stage side transistor chip TF, a collector resistivity $\rho N^-$ of the collector high resistivity layer 11 is set to 80 $\Omega$cm and its collector film thickness $tN^-$ is set to 120 $\mu$m, and in the rear stage transistor chip TR, a collector resistivity $\rho N^-$ of the collector high resistivity layer 13 is set to 45 $\Omega$cm and its collector film thickness $tN^-$ is set to 140 $\mu$m. Thus, the transistor Q3 of the third stage and the transistor Q4 of the fourth stage meet <Theory 2>.

A transistor which meets <Theory 1> is a four-stage transistor Q4 (r=45/140=about 0.32).

<4-9. Method of Manufacturing a Device of the Fourth Preferred Embodiment>
Similar to the first preferred embodiment, the front stage side transistor chip TF and the rear stage side transistor chip TR are separately manufactured.

<4-10. Arrangement of a Device of a Fifth Preferred Embodiment> A Darlington transistor of a fifth preferred embodiment is equivalent to a case where:

M=4, m=2

Figure 40:
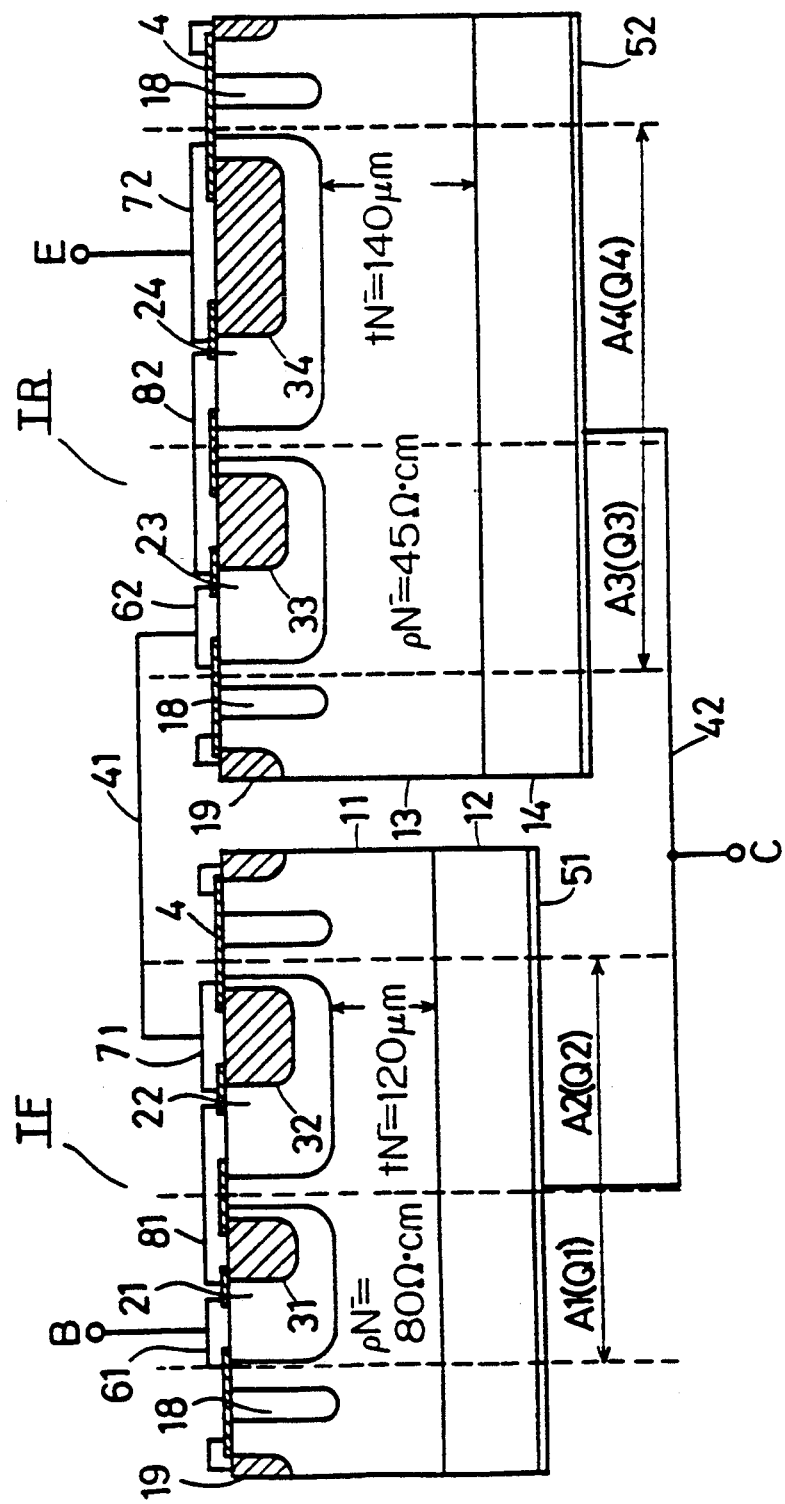
FIG. 40 is a sectional view showing an arrangement of a four-stage Darlington transistor of a fifth preferred embodiment.

FIG. 40 is a sectional view showing an arrangement of a four-stage Darlington transistor of the fifth preferred embodiment. As shown in FIG. 40, in a front stage transistor chip TF, a collector high resistivity layer 11 is formed on a collector low resistivity layer 12. A base region 21 of a transistor Q1 is formed in an area A1 of an upper portion of the collector high resistivity layer 11 while a base region 22 of a transistor Q2 is formed in an area A2, and emitter regions 31 and 32 are selectively formed in surfaces of the base regions 21 and 22. Moreover, a front stage side collector electrode 51 is formed on a surface of the collector low resistivity layer 12, a front stage side base electrode 61 is formed on the base region 21 of the transistor Q1, a front stage side emitter electrode 71 is formed on the emitter region 32 of the transistor Q2, and a base-emitter connecting electrode 81 is formed over from the emitter region 31 of the transistor Q1 to the base region 22 of the transistor Q2. Reference numeral denotes an oxide film, numeral 18 denotes a girdling, and numeral 19 denotes a channel stop, respectively.

On the other hand, in a rear stage side transistor chip TR, a collector high resistivity layer 13 is formed on a surface of a collector low resistivity layer 14. Base regions 23 and 24 of transistors Q3 and Q4 are formed in areas A3 and A4 of an upper portion of the collector high resistivity layer 13, respectively, and emitter regions 33 and 34 are selectively formed on surfaces of the base regions 23 and 24. Then, a rear stage side collector electrode 52 is formed on the surface of the collector low resistivity layer 14, a rear stage side base electrode 62 is formed on the base region 23 of the transistor Q3, a rear stage side emitter electrode 72 is formed on the emitter region 34 of the transistor Q4, and a base-emitter connecting electrode 82 is formed over from the emitter region 33 of the transistor Q3 to the base region 24 of the transistor Q4. Reference numeral 4 denotes an oxide film, numeral 18 denotes a girdling, and numeral 19 denotes a channel stop, respectively.

The front stage side emitter electrode 71 and the rear stage side base electrode 62 are electrically connected by wiring 41 while the front stage side collector electrode 51 and the rear stage side collector electrode 52 are electrically connected by wiring 42. Thus, the front stage side base electrode 61 acts as a base electrode of a four-stage Darlington transistor, the rear stage side emitter electrode 72 acts as its emitter electrode, and the front stage side collector electrodes 51 and the rear stage side collector electrode 52 act as its collector electrodes.

In the front stage side transistor chip TF, a collector resistivity $\rho N^-$ of the collector high resistivity layer 11 is set to 80 $\Omega$cm and its collector film thickness $tN^-$ is set to 120 um, and in the rear stage transistor chip TR, a collector resistivity $\rho N^-$ of the collector high resistivity layer 13 is set to 45 $\Omega$cm and its collector film thickness $tN^-$ is set to 140 $\mu$m. Thus, the transistor Q2 of the second stage and the transistor Q3 of the third stage meet <Theory 2>. Transistors which meet <Theory 1> are three-stage and four-stage transistors Q3 and Q4 (r=45/140 =about 0.32).

<4-11. Method of Manufacturing a Device of the Fifth Preferred Embodiment>

Similar to the first preferred embodiment, the front stage side transistor chip TF and the rear stage side transistor chip TR are separately manufactured.

<4-12. Arrangement of a Device of a Sixth Preferred Embodiment>

A Darlington transistor of a sixth preferred embodiment is equivalent to a case where:

M=4, m=1

Figure 41:
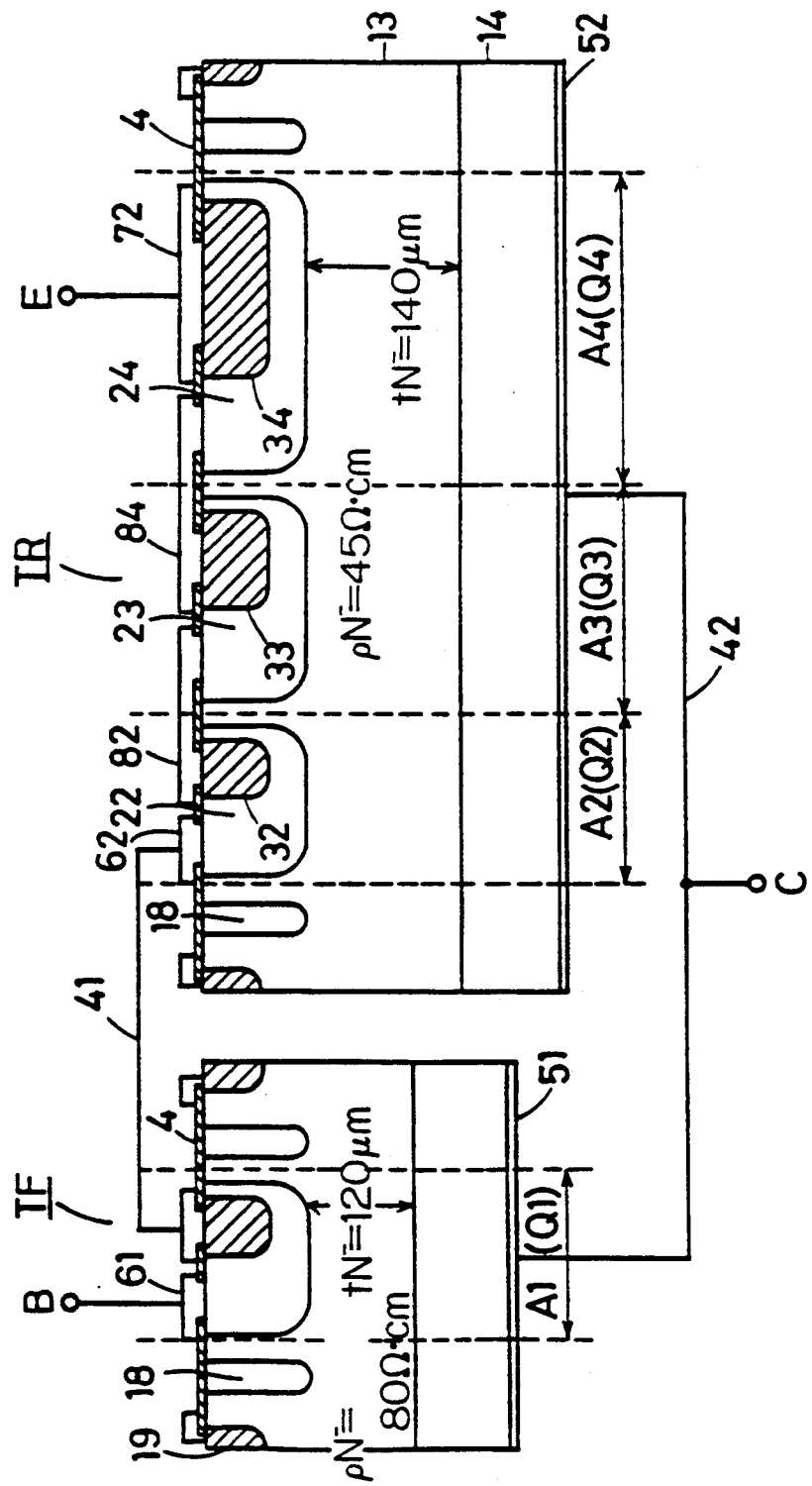
FIG. 41 is a sectional view showing an arrangement of a four-stage Darlington transistor of a sixth preferred embodiment.

FIG. 41 is a sectional view showing an arrangement of a four-stage Darlington transistor of the sixth preferred embodiment. As shown in FIG. 41, in a front stage transistor chip TF, a collector high resistivity layer 11 is formed on a collector low resistivity layer 12. A base region 21 of a transistor Q1 is formed in an area A1 of an upper portion of the collector high resistivity layer 11, and an emitter region 31 is selectively formed in a surface of the base region 21. Moreover, a front stage side collector electrode 51 is formed on a surface of the collector low resistivity layer 12, a front stage side base electrode 61 is formed on the base region 21 of the transistor Q1, and a front stage side emitter electrode 71 is formed on the emitter region 32 of the transistor Q2. Reference numeral 4 denotes an oxide film, numeral 18 denotes a girdling, and numeral 19 denotes a channel stop, respectively.

On the other hand, in a rear stage side transistor chip TR, a collector high resistivity layer 13 is formed on a surface of a collector low resistivity layer 14. Base regions 22 through 24 of transistors Q2 through Q4 are formed in areas A2 through A4 of an upper portion of the collector high resistivity layer 13, respectively, and emitter regions 32 through 34 are selectively formed on surfaces of the base regions 22 through 24. Then, a rear stage side collector electrode 52 is formed on the surface of the collector low resistivity layer 14, a rear stage side base electrode 62 is formed on the base region 22 of the transistor Q2, a rear stage side emitter electrode 72 is formed on the emitter region 34 of the transistor Q4, and a base-emitter connecting electrode 82 is formed over from the emitter region 32 of the transistor Q2 to the base region 24 of the transistor Q4. Reference numeral 4 denotes an oxide film, numeral 18 denotes a girdling, and numeral 19 denotes a channel stop, respectively.

The front stage side emitter electrode 71 and the rear stage side base electrode 62 are electrically connected by wiring 41 while the front stage side collector electrode 51 and the rear stage side collector electrode 52 are electrically connected by wiring 42. Thus, the front stage side base electrode 61 acts as a base electrode of a four-stage Darlington transistor, the rear stage side emitter electrode 72 acts as its emitter electrode, and the front stage side collector electrodes 51 and the rear stage side collector electrode 52 act as its collector electrodes.

In the front stage side transistor chip TF, a collector resistivity $\rho N^-$ of the collector high resistivity layer 11 is set to 80 $\Omega$cm and its collector film thickness $tN^-$ is set to 120 $\mu$m, and in the rear stage transistor chip TR, a collector resistivity $\rho N^-$ of the collector high resistivity layer 13 is set to 45 $\Omega$cm and its collector film thickness $tN^-$ is set to 140 $\mu$m. Thus, the transistor Q1 of the first stage and the transistor Q2 of the second stage meet <Theory 2>.

Transistors which meet <Theory 1> are two-stage, three-stage and four-stage transistor Q2, Q3 and Q4 (r=45/140=about 0.32).

<4-13. Method of Manufacturing a Device of the Sixth Preferred Embodiment>

Similar to the first preferred embodiment, the front stage side transistor chip TF and the rear stage side transistor chip TR are separately manufactured.

<4-14. Arrangement of a Device of a Seventh Preferred Embodiment>

A Darlington transistor of a seventh preferred embodiment is equivalent to a case where:

M=4, i=1, 2, 3

Figure 42:
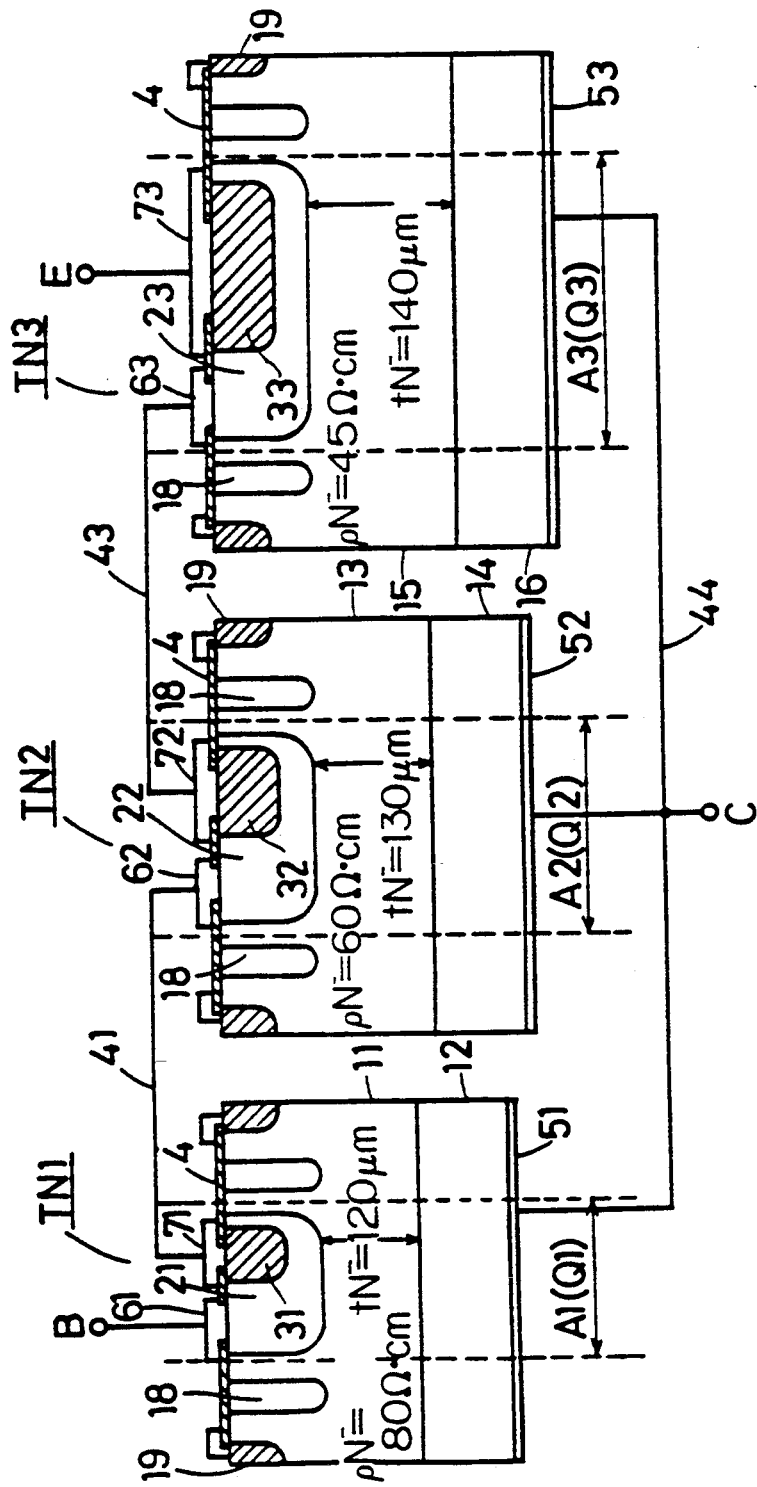
FIG. 42 is a sectional view showing an arrangement of a three-stage Darlington transistor of a seventh preferred embodiment.

FIG. 42 is a sectional view showing an arrangement of a three-stage Darlington transistor of the seventh preferred embodiment. The three-stage Darlington transistor is comprised of three transistor chips; namely, first stage, second stage, and third stage transistor chips TN1, TN2, and TN3. As shown in FIG. 42, in a first stage transistor chip TN1, a collector high resistivity layer 11 is formed on a collector low resistivity layer 12. A base region 21 of a transistor Q1 is formed in an area A1 of an upper portion of the collector high resistivity layer 11, and an emitter region 31 is selectively formed in a surface of the base region 21. Moreover, a first stage collector electrode 51 is formed on a surface of the collector low resistivity layer 12, a first stage base electrode 61 is formed on the base region 21 of the transistor Q1, and a first stage emitter electrode 71 is formed on the emitter region 32 of the transistor Q2. Reference numeral 4 denotes an oxide film, numeral 18 denotes a girdling, and numeral 19 denotes a channel stop, respectively.

On the other hand, in the second stage transistor chip TN2, a collector high resistivity layer 13 is formed on a surface of a collector low resistivity layer 14. A base region 22 of the transistor Q2 is formed in an area A2 of an upper portion of the collector high resistivity layer 13, and an emitter region 32 is selectively formed in a surface of the base region 22. Then, a second stage collector electrode 52 is formed on the surface of the collector low resistivity layer 14, a second stage base electrode 62 is formed on the base region 22 of the transistor Q2, a rear stage side emitter electrode 72 is formed on the emitter region 32 of the transistor Q2. Reference numeral 4 denotes an oxide film, numeral 18 denotes a girdling, and numeral 19 denotes a channel stop, respectively.

In the third stage transistor chip TN3, a collector high resistivity layer 15 is formed on a collector low resistivity layer 16. A base region 23 of a transistor Q3 is formed in an area A3 of an upper portion of the collector high resistivity layer 15, and an emitter region 33 is selectively formed in a surface of a base region 23. A third stage collector electrode 53 is formed on a surface of the collector low resistivity layer 16, a third stage base electrode 63 is formed on the base region 23 of the transistor Q3, and a third stage emitter electrode 73 is formed on the emitter region 33 of the transistor Q3. Reference numeral 4 denotes an oxide film, numeral 18 denotes a girdling, and numeral 19 denotes a channel stop.

The first stage emitter electrode 71 and the second stage base electrode 62 are electrically connected by wiring 41, the second stage collector electrode 72 and the third stage base electrode 63 are electrically connected by wiring 43, and the first stage collector electrode 51, the second stage collector electrode 52, and the third stage collector electrode 53 are electrically connected commonly by wiring 44. Thus, the first stage base electrode 61 acts as a base electrode of a three-stage Darlington transistor, the third stage emitter electrode 73 acts as its emitter electrode, and the first stage collector electrodes 51, the second stage collector electrode 52, and the third stage collector electrode 53 act as its collector electrodes. In the first stage transistor chip TN1, a collector resistivity $\rho N^+$ of the collector high resistivity layer 11 is set to 80 $\Omega$cm and its collector film thickness $tN^-$ is set to 120 $\mu$m; in the second stage transistor chip TN2, a collector resistivity $\rho N^-$ of the collector high resistivity layer 13 is set to 60 $\Omega$cm and its collector film thickness $tN^-$ is set to 130 $\mu$m; in the third stage transistor chip TN3, a collector resistivity $\rho N^-$ of the collector high resistivity layer 13 is set to 45 $\Omega$cm and its collector film thickness $tN^-$ is set to 140 $\mu$m. Thus, the transistor Q1 of the first stage and the transistor Q2 of the second stage meet <Theory 2>. Transistors which meet <Theory 2> are the transistor Q2 of the second stage and a transistor Q3 of the third stage.

Transistors which meet <Theory 1> are the second stage transistor Q2 (r =60/130=about 0.46) and the third stage transistor Q3 (r=45/140=about 0.32).

<4-15. Method of Manufacturing a Device of the Seventh Preferred Embodiment>

Similar to the first preferred embodiment, the first stage transistor chip TN1, the second stage transistor chip TN2, and the third stage transistor chip TN3 are separately manufactured.

<4-16. Arrangement of a Device of an Eighth Preferred Embodiment>

A Darlington transistor of an eighth preferred embodiment is equivalent to a case where:

M=4, i=1, 2, 3, 4

Figure 43:
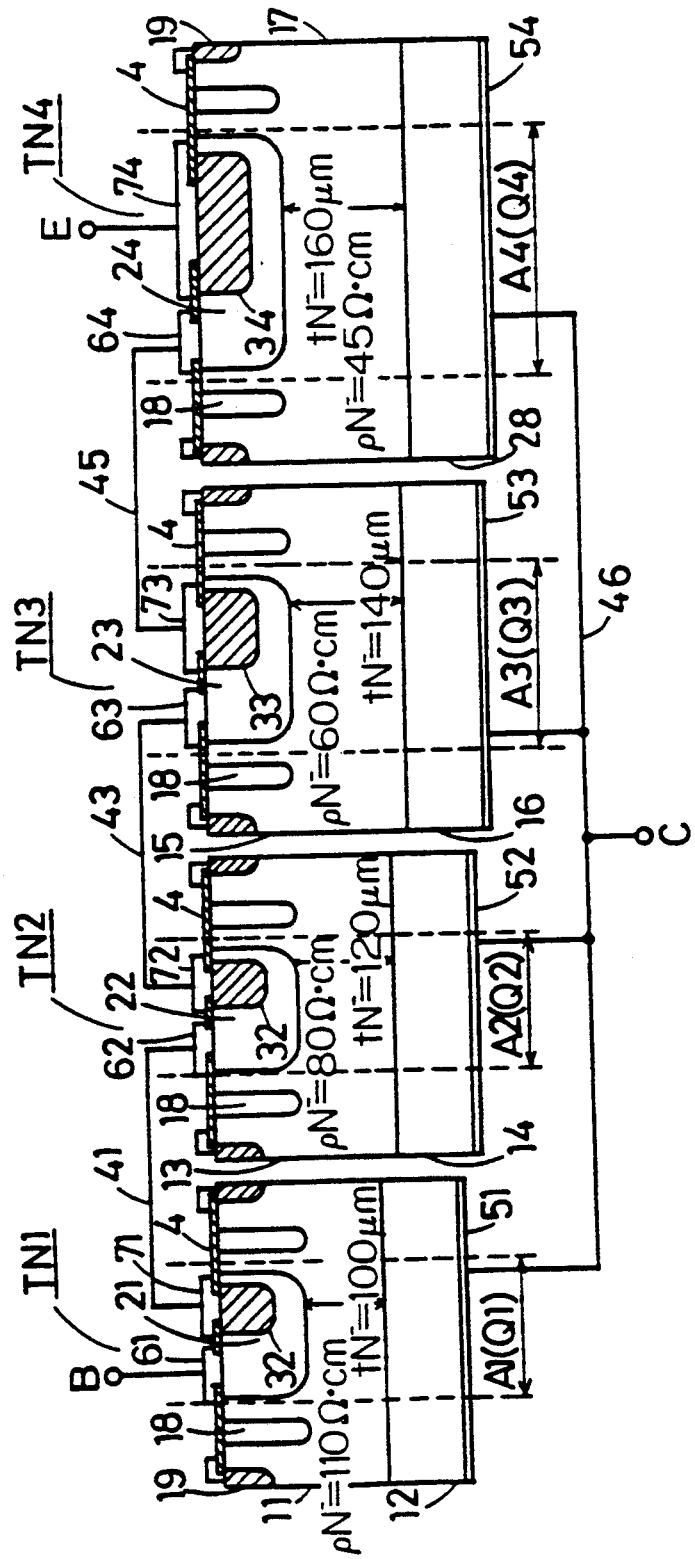
FIG. 43 is a sectional view showing an arrangement of a four-stage Darlington transistor of an eighth preferred embodiment.
Figure 44:
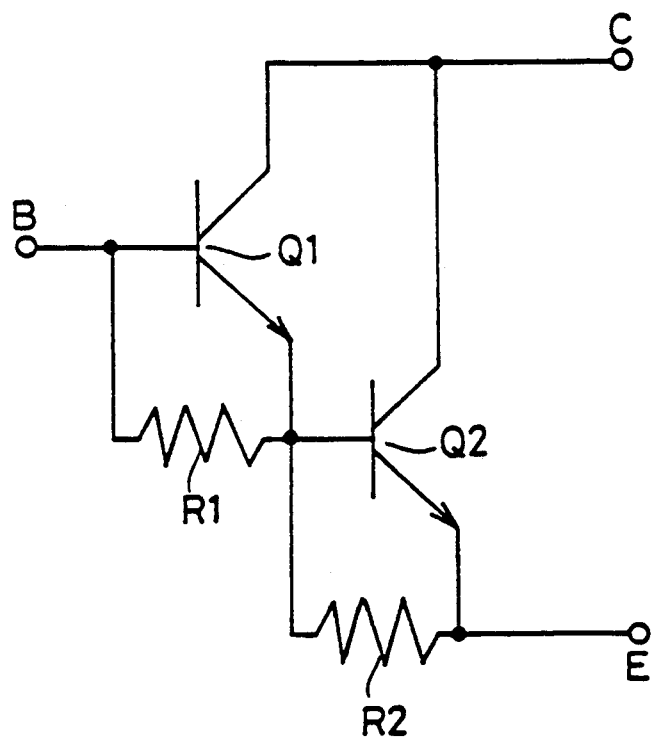
FIG. 44 is a circuit diagram showing an arrangement of a two-stage Darlington transistor.

FIG. 43 is a sectional view showing an arrangement of a four-stage Darlington transistor of the eighth preferred embodiment. The four-stage Darlington transistor is comprised of first stage, second stage, third stage and fourth stage transistor chips TN1, TN2, TN3 and TN4 and four transistor chips. As shown in FIG. 43, in a first stage transistor chip TN1, a collector high resistivity layer 11 is formed on a collector low resistivity layer 12. A base region 21 of a transistor Q1 is formed in an area A1 of an upper portion of the collector high resistivity layer 11, and an emitter region 31 is selectively formed in a surface of the base region 21. Moreover, a first stage collector electrode 51 is formed on a surface of the collector lowresistivity layer 12, a first stage base electrode 61 is formed on the base region 21 of the transistor Q1, and a first stage emitter electrode 71 is formed on the emitter region 32 of the transistor Q2. Reference numeral 4 denotes an oxide film, numeral 18 denotes a girdling, and numeral 19 denotes a channel stop, respectively.

On the other hand, in the second stage transistor chip TN2, a collector high resistivity layer 13 is formed on a surface of a collector low resistivity layer 14. A base region 22 of the transistor Q2 is formed in an area A2 of an upper portion of the collector high resistivity layer 13, and an emitter region 32 is selectively formed in a surface of the base region 22. Then, a second stage collector electrode 52 is formed on the surface of the collector low resistivity layer 14, a second stage base electrode 62 is formed on the base region 22 of the transistor Q2, and a rear stage side emitter electrode 72 is formed on the emitter region 32 of the transistor Q2. Reference numeral 4 denotes an oxide film, numeral 18 denotes a girdling, and numeral 19 denotes a channel stop, respectively.

In the third stage transistor chip TN3, a collector high resistivity layer 15 is formed on a collector low resistivity layer 16. A base region 23 of a transistor Q3 is formed in an area A3 of an upper portion of the collector high resistivity layer 15, and an emitter region 33 is selectively formed in a surface of a base region 23. A third stage collector electrode 53 is formed on a surface of the collector low resistivity layer 16, a third stage base electrode 63 is formed on the base region 23 of the transistor Q3, and a third stage emitter electrode 73 is formed on the emitter region 33 of the transistor Q3. Reference numeral 4 denotes an oxide film, numeral 18 denotes a girdling, and numeral 19 denotes a channel stop.

In the fourth stage transistor chip TN4, a collector high resistivity layer 17 is formed on a collector low resistivity layer 28. A base region 24 of a transistor Q4 is formed in an area A4 of an upper portion of the collector high resistivity layer 17, and an emitter region 34 is selectively formed in a surface of a base region 24. A fourth stage collector electrode 54 is formed on a surface of the collector low resistivity layer 28, a fourth stage base electrode 64 is formed on the base region 24 of the transistor Q4, and a fourth stage emitter electrode 74 is formed on the emitter region 34 of the transistor Q4. Reference numeral 4 denotes an oxide film, numeral 18 denotes a girdling, and numeral 19 denotes a channel stop.

The first stage emitter electrode 71 and the second stage base electrode 62 are electrically connected by wiring 41, the second stage collector electrode 72 and the third stage base electrode 63 are electrically connected by wiring 43, the third emitter electrode 73 and the fourth stage base electrode 64 are electrically connected by wiring 45, and the first stage collector electrode 51, the second stage collector electrode 52, the third stage collector electrode 53, and the fourth stage collector electrode 54 are electrically connected commonly by wiring 46. Thus, the first stage base electrode 61 acts as a base electrode of a four-stage Darlington transistor, the fourth stage emitter electrode 74 acts as its emitter electrode, and the first stage collector electrodes 51, the second stage collector electrode 52, the third stage collector electrode 53 and the fourth stage collector electrode 54 act as its collector electrodes.

In the first stage transistor chip TN1, a collector resistivity $\rho N^-$ of the collector high resistivity layer 11 is set to 100 Ωcm and its collector film thickness $tN^-$ is set to 100 μm; in the second stage transistor chip TN2, a collector resistivity $\rho N^-$ of the collector high resistivity layer 13 is set to 80 Ωcm and its collector film thickness $tN^-$ is set to 120 μm; in the third stage transistor chip TN3, a collector resistivity $\rho N^-$ of the collector high resistivity layer 15 is set to 60 Ωcm and its collector film thickness $tN^-$ is set to 140 μm; in the fourth stage transistor chip TN4, a collector resistivity $\rho N$ of the collector high resistivity layer 17 is set to 45 Ωcm and its collector film thickness $tN^-$ is set to 160 μm. Thus, transistors which meet <Theory 2> are the transistor Q1 of the first stage and the transistor Q2 of the second stage, transistors which meet <Theory 2> are the transistor Q2 of the second stage and the transistor Q3 of the third stage, and transistors which meet <Theory 2> are the transistor Q3 of the third stage and the transistor Q4 of the fourth stage.

Transistors which meet <Theory 1> are the third stage transistor Q3 (r =60/130 32 about 0.46) and the fourth stage transistor Q4 (r=45/160=about 0.28).

<4-17. Method of Manufacturing a Device of the Eighth Preferred Embodiment>

Similar to the first preferred embodiment, the first stage transistor chip TN1, the second stage transistor chip TN2, the third stage transistor chip TN3, and the fourth stage transistor chip TN4 are separately manufactured.

Extent to which Effects of Theory <2-1>Are Attained

In the first, second, fourth, seventh and eighth preferred embodiments, the last stage transistor chip is constituted by a single transistor, and <Theory 2-1> is met between the last stage transistor and a front stage transistor of the last stage. In this case, as shown by the curve L15 of FIG. 11, an endurance limit against breakdown in an extremely good high voltage region can be obtained without deteriorating an endurance limit against short-circuit.

On the other hand, in the third, fifth and sixth preferred embodiment, the last stage transistor chip is constituted by two or more transistors, and <Theory 2-1> is not met between the last stage transistor and the front stage transistor of the last stage. In this case, such an extremely good high voltage property as in the curve L15 of FIG. 11 cannot be obtained. However, <Theory 2-1> is met between at least one front stage transistor and rear stage transistor other than between the last stage transistor and the front stage transistor of the last stage, and therefore, a better high voltage property can be obtained compared with a Darlington transistor configured as in the prior art.

Variations

There is no necessity that <Theory 2-1>and <Theory 2-2>of the present invention are necessarily applied simultaneously, but <Theory 2-1>alone can be applied.

The Darlington transistor of the present invention can be applied to either an NPN transistor or a PNP transistor.

The transistor of an arrangement according <Theory 1>can be applied not only to a Darlington connection transistor but to a single bipolar transistor or a bipolar transistor connected in other ways.

As has been described, a bipolar transistor as defined in Claim 1 and a bipolar transistor manufactured in a method as defined in Claim 4 have a rate $\rho/t$ of a resistivity $\rho$(Ωcm) of a collector high resistivity layer to a film thickness t(μm) of the collector high resistivity layer just below a base region set to 0.6 or under, and hence, a high voltage property can be enhanced.

As a result, a high voltage property of a high voltage power bipolar transistor can be improved.

Also, a Darlington transistor as defined in Claim 2 and a Darlington transistor manufactured in a method as defined in Claim 5 have a resistivity of a first collector high resistivity layer of a front stage bipolar transistor larger than that of a second collector high resistivity layer of a rear stage bipolar transistor, and hence, an endurance limit against breakdown in a good high voltage region can be obtained without deteriorating an endurance limit against short-circuit.

A Darlington transistor ad defined in Claim 3 and a Darlington transistor manufactured in a method as defined in Claim 6 have a film thickness of the first collector high resistivity layer just below a first base region of a front stage bipolar transistor smaller than that of a second collector high resistivity layer just below a second base region of a rear stage bipolar transistor, and hence, a low voltage property (saturation voltage) can be improved.

As a result, an improvement of a comprehensive electricity characteristic including high and low voltage properties of a high voltage power Darlington transistor can be attained.

While the invention has been shown and described in detail, the foregoing description is in all aspects illustrative and not restrictive. It is therefore understood that numerous modifications and variations can be devised without departing from the scope of the invention.

We claim:

1. A Darlington transistor comprising
   a first bipolar transistor formed on a first semiconductor substrate; and
   a second bipolar transistor formed on a second semiconductor substrate;
   said first and second bipolar transistors being arranged in Darlington connection, having a front stage of said first bipolar transistor and a rear stage of said second bipolar transistor;
   said first bipolar transistor including a first collector low resistivity layer, a first collector high resistivity layer formed on said first collector low resistivity layer and having its resistivity set higher than a resistivity of said first collector low resistivity layer, a first base region formed in a surface of said first collector high resistivity layer, and a first emitter region formed in a surface of said first base region;

said second bipolar transistor including a second collector low resistivity layer, a second collector high resistivity layer formed on said second collector low resistivity layer and having its resistivity set higher than a resistivity of said second collector low resistivity layer, a second base region formed in a surface of said second collector high resistivity layer, and a second emitter region formed in a surface of said second base region; characterized in that a resistivity of said first collector high resistivity layer is set higher than a resistivity of said second collector high resistivity layer.

2. A Darlington transistor according to claim 1, wherein a film thickness of said first collector high resistivity layer just below said first base region is set smaller than a film thickness of said second collector high resistivity layer just below said second base region.

3. A Darlington transistor according to claim 2, wherein first to M (an integer of 2 or above)-th transistors arranged in Darlington connection,
   a m-th stage transistor ($1<m<M$) is provided as a front stage transistor; and
   a (m+1)-th stage transistor is provided as a rear stage transistor.

4. A Darlington transistor according to claim 3, wherein M=2 and m=1;
   said resistivity of a first stage transistor of said front stage transistor is 110 Ωcm and said film thickness is 110 μm; and
   said resistivity of a second stage transistor of said rear stage transistor is 45 Ωcm and said film thickness is 160 μm.

5. A Darlington transistor according to claim 3, wherein M=3 and m=1;
   said resistivity of a first stage transistor of said front stage transistor is 120 Ωcm and said film thickness is 80 μm; and
   said resistivity of a second stage transistor of said rear stage transistor is 45 Ωcm and said film thickness is 140 μm.

6. A Darlington transistor according to claim 3, wherein M=4 and m=3;
   said resistivity of a third stage transistor of said front stage transistor is 120 Ωcm and said film thickness is 80 μm; and
   said resistivity of a fourth stage transistor of said rear stage transistor is 45 Ωcm and said film thickness is 140 μm.

7. A Darlington transistor according to claim 3, wherein M=4 and m=2;
   said resistivity of a second stage transistor of said front stage transistor is 120 Ωcm and said film thickness is 80 μm; and
   said resistivity of a third stage transistor of said rear stage transistor is 45 Ωcm and said film thickness is 140 μm.

8. A Darlington transistor according to claim 3, wherein M=4 and m=1;
   said resistivity of a first stage transistor of said front stage transistor is 120 Ωcm and said film thickness is 80 μm; and
   said resistivity of a second stage transistor of said rear stage transistor is 45 Ωcm and said film thickness is 140 μm.

* * * * *